(12) United States Patent
Hagleitner et al.

(10) Patent No.: US 10,090,394 B2
(45) Date of Patent: *Oct. 2, 2018

(54) OHMIC CONTACT STRUCTURE FOR GROUP III NITRIDE SEMICONDUCTOR DEVICE HAVING IMPROVED SURFACE MORPHOLOGY AND WELL-DEFINED EDGE FEATURES

(71) Applicant: Cree, Inc., Durham, NC (US)

(72) Inventors: Helmut Hagleitner, Zebulon, NC (US); Jason Gurganus, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/361,682

(22) Filed: Nov. 28, 2016

(65) Prior Publication Data

US 2017/0077254 A1    Mar. 16, 2017

Related U.S. Application Data

(63) Continuation of application No. 13/182,679, filed on Jul. 14, 2011, now Pat. No. 9,548,206, which is a continuation-in-part of application No. 12/704,013, filed on Feb. 11, 2010, now Pat. No. 8,563,372.

(51) Int. Cl.
| | |
|---|---|
| *H01L 21/285* | (2006.01) |
| *H01L 29/45* | (2006.01) |
| *H01L 29/20* | (2006.01) |
| *H01L 29/66* | (2006.01) |
| *H01L 29/778* | (2006.01) |

(52) U.S. Cl.
CPC ...... *H01L 29/452* (2013.01); *H01L 21/28575* (2013.01); *H01L 29/2003* (2013.01); *H01L 29/66462* (2013.01); *H01L 29/7787* (2013.01)

(58) Field of Classification Search
CPC .................................................... H01L 29/452
See application file for complete search history.

(56) References Cited

U.S. PATENT DOCUMENTS

| | | | |
|---|---|---|---|
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| 5,355,020 | A | 10/1994 | Lee et al. |

(Continued)

OTHER PUBLICATIONS

Baca, A.G., "A survey of ohmic contacts to III-IV compound semiconductors," Thin Solid Films, vol. 308-309, Oct. 31, 1997, pp. 599-606.

(Continued)

*Primary Examiner* — Asok K Sarkar
*Assistant Examiner* — Grant Withers
(74) *Attorney, Agent, or Firm* — Anthony J. Josephson

(57) ABSTRACT

Embodiments of an ohmic contact structure for a Group III nitride semiconductor device and methods of fabrication thereof are disclosed. In general, the ohmic contact structure has a root-mean-squared (RMS) surface roughness of less than 10 nanometers, and more preferably less than or equal to 7.5 nanometers, and more preferably less than or equal to 5 nanometers, and more preferably less than or equal to 2 nanometers, and even more preferably less than or equal to 1.5 nanometers.

24 Claims, 17 Drawing Sheets

(56) References Cited

U.S. PATENT DOCUMENTS

| | | | |
|---|---|---|---|
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter, Jr. et al. |
| 6,316,793 | B1 | 11/2001 | Sheppard et al. |
| 6,548,333 | B2 | 4/2003 | Smith |
| 6,912,163 | B2 | 6/2005 | Zheng et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 8,144,498 | B2 | 3/2012 | Kumar et al. |
| 8,563,372 | B2 | 10/2013 | Hagleitner et al. |
| 9,214,352 | B2 | 12/2015 | Hagleitner et al. |
| 9,548,206 | B2 * | 1/2017 | Hagleitner ........ H01L 21/28575 |
| 2004/0180220 | A1 | 9/2004 | Gueneau et al. |
| 2005/0277290 | A1 | 12/2005 | Yang et al. |
| 2006/0192194 | A1 | 8/2006 | Erchak et al. |
| 2006/0244010 | A1 | 11/2006 | Saxler |
| 2006/0251800 | A1 | 11/2006 | Weidman et al. |
| 2007/0018210 | A1 | 1/2007 | Sheppard |
| 2007/0164322 | A1 | 7/2007 | Smith et al. |
| 2008/0116464 | A1 | 5/2008 | Ward, III et al. |
| 2008/0315419 | A1 | 12/2008 | Gaska et al. |
| 2009/0244423 | A1 | 10/2009 | Hirakata et al. |
| 2010/0065803 | A1 | 3/2010 | Choi et al. |
| 2010/0219394 | A1 | 9/2010 | Jiang et al. |

OTHER PUBLICATIONS

Biswas et al., "Evaluation of nickel and molybdenum silicides for dual gate complementary metal-oxide semiconductor application," Applied Physics Letters 86:022105-1 thru 022105-3, 2005.

Deeb, C. et al., "A low-temperature route to thermodynamically stable ohmic contacts to n-type 6H—SiC," Applied Physics Letters, vol. 84, No. 7, Feb. 16, 2004, American Institute of Physics, pp. 1117-1119.

Gambino et al., "Silicides and ohmic contacts," Materials Chemistry and Physics, vol. 52, 1998, pp. 99-146.

Xin, H.P. et al., "Optimization of AlGaN/GaN HEMT Ohmic Contacts for Improved Surface Morphology with Low Contact Resistance," CS MANTECH Conference, May 17-20, 2010, Portland, Oregon, pp. 149-152.

Jacobs, B. et al., "Optimization of the Ti/Al/Ni/Au ohmic contact on AlGaN/GaN FET structures," Journal of Crystal Growth, vol. 241, 2002, Elsevier Science B.V., pp. 15-18.

Jang, Ho Won et al., "Mechanism for ohmic contact formation of Ni/Ag contacts on p-type GaN," Applied Physics Letters, vol. 85, No. 24, Dec. 13, 2004, American Institute of Physics, pp. 5920-5922.

Kolaklieva, Lilyana et al., "Ohmic Contacts for High Power and High Temperature Microelectronics," Micro Electronic and Mechanical Systems, InTech, Dec. 2009, pp. 293-318.

Luo, B. et al., "Improved morphology for ohmic contacts to AlGaN/GaN high electron mobility transistors using Wsix or W-based metallization," Applied Physics Letters, vol. 82, No. 22, Jun. 2003, pp. 3910-3912.

Ohki, T et al., "Al-free Ti/Mo/Ta/Au-based n-type ohmic contact with a smooth surface for AlGaN/GaN power HEMTS," Phys. Stat. Sol. (c), vol. 2, No. 7, Feb. 8, 2005, pp. 2529-2532.

Pecz, B et al., "TEM study of Ni and Ni2Si ohmic contacts in SiC," Diamond and Related Materials, vol. 6, 1997, pp. 1428-1431.

Piazza, Michele et al., "Degradation of TiAlNiAu as ohmic contact metal for GaN HEMTs," Microelectronics Reliability, vol. 49, Issue 9-11, Sep.-Nov. 2009, Elsevier Ltd., pp. 1222-1225.

Roman, W.J., "Development of AlGaN/GaN HEMT Technology for Highest Frequency Operation," NSF IREE 2008 Grantees Conference, May 2008, Washington, D.C., pp. 164-165.

Shur, M., "GaN-Based Electronic Devices," Selected Topics in Electronics and Systems, Chapter 5, World Scientific Publishing Co., Oct. 2004, pp. 61-86.

Yung-Ling Lan et al., "Improved Surface Morphology and Edge Definition for Ohmic Contacts to AlGaN/GaN Heterostructures," Gallium Nitride Materials and Devices IV, Proceedings of SPIE, vol. 7216, pp. 72162P-1 through 72162P-5.

International Search Report for International Patent Application No. PCT/US2011/023975, dated Mar. 30, 2011, 6 pages.

International Preliminary Report on Patentability for International Patent Application No. PCT/US2011/023975, dated Aug. 23, 2012, 6 pages.

Non-Final Office Action for U.S. Appl. No. 12/704,013, dated May 18, 2012, 9 pages.

Final Office Action for U.S. Appl. No. 12/704,013, dated Aug. 23, 2012, 16 pages.

Advisory Action for U.S. Appl. No. 12/704,013, dated Oct. 26, 2012, 3 pages.

Non-Final Office Action and Interview Summary for U.S. Appl. No. 12/704,013, dated Dec. 21, 2012, 17 pages.

Final Office Action for U.S. Appl. No. 12/704,013, dated Apr. 18, 2013, 12 pages.

Notice of Allowance for U.S. Appl. No. 12/704,013, dated Jul. 10, 2013, 11 pages.

Non-Final Office Action for U.S. Appl. No. 13/182,661 dated Dec. 6, 2012, 7 pages.

Final Office Action for U.S. Appl. No. 13/182,661, dated May 29, 2013, 12 pages.

Notice of Allowance for U.S. Appl. No. 13/182,661, dated Aug. 16, 2013, 19 pages.

Final Office Action for U.S. Appl. No. 13/182,661, dated Oct. 8, 2013, 12 pages.

Advisory Action for U.S. Appl. No. 13/182,661, dated Dec. 27, 2013, 2 pages.

Non-Final Office Action for U.S. Appl. No. 13/182,661, dated Jun. 16, 2014, 12 pages.

Non-Final Office Action for U.S. Appl. No. 13/182,661, dated Oct. 15, 2014, 13 pages.

Notice of Allowance for U.S. Appl. No. 13/182,661, dated Mar. 6, 2015, 7 pages.

Notice of Allowance for U.S. Appl. No. 13/182,661, dated Aug. 5, 2015, 7 pages.

Non-Final Office Action for U.S. Appl. No. 13/182,679 dated Dec. 10, 2012, 12 pages.

Final Office Action and Examiner-Initiated Interview Summary for U.S. Appl. No. 13/182,679, dated Jul. 17, 2013, 17 pages.

Advisory Action for U.S. Appl. No. 13/182,679, dated Oct. 3, 2013, 6 pages.

Examiner's Answer for U.S. Appl. No. 13/182,679, dated Jun. 20, 2014, 20 pages.

Decision on Appeal for U.S. Appl. No. 13/182,679, dated Jun. 6, 2016, 8 pages.

Notice of Allowance for U.S. Appl. No. 13/182,679, dated Aug. 22, 2016, 13 pages.

\* cited by examiner

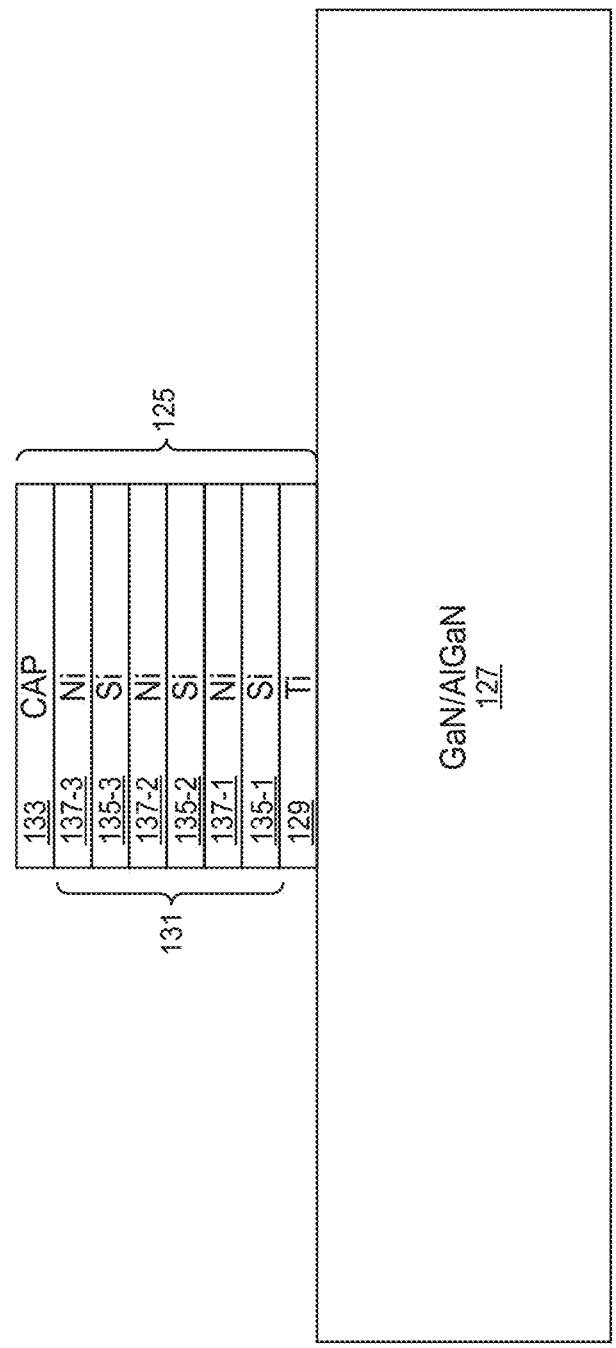

OHMIC CONTACT STRUCTURE FOR GROUP III NITRIDE SEMICONDUCTOR DEVICE HAVING IMPROVED SURFACE MORPHOLOGY AND WELL-DEFINED EDGE FEATURES

RELATED APPLICATIONS

This application is a Continuation of U.S. patent application Ser. No. 13/182,679, filed Jul. 14, 2011, entitled OHMIC CONTACT STRUCTURE FOR GROUP III NITRIDE SEMICONDUCTOR DEVICE HAVING IMPROVED SURFACE MORPHOLOGY AND WELL-DEFINED EDGE FEATURES, now U.S. Pat. No. 9,548,206, the disclosure of which is incorporated herein by reference in its entirety.

U.S. patent application Ser. No. 13/182,679 is a continuation-in-part of U.S. patent application Ser. No. 12/704,013, entitled METHODS OF FORMING CONTACT STRUCTURES INCLUDING ALTERNATING METAL AND SILICON LAYERS AND RELATED DEVICES, now U.S. Pat. No. 8,563,372, assigned to the assignee of the present application, and incorporated herein by reference in its entirety.

GOVERNMENT SUPPORT

This invention was made with government funds under contract number 05-D-6000 awarded by NAVSEA. The U.S. Government may have rights in this invention.

FIELD OF THE DISCLOSURE

The present disclosure relates to ohmic contact structures for semiconductor devices.

BACKGROUND

Materials such as silicon (Si) and gallium arsenide (GaAs) have found wide application in semiconductor devices for lower power and (in the case of Si) lower frequency applications. However, these more familiar semiconductor materials may not be well suited for high power and/or high frequency applications because of their relatively small bandgaps (e.g., 1.12 electron volts (eV) for Si and 1.42 eV for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (SiC) (2.996 eV for alpha SiC at room temperature) and the Group III nitrides (e.g., 3.36 eV for gallium nitride (GaN) at room temperature). These materials, typically, have higher electric field breakdown strengths and higher electron saturation velocities as compared to GaAs and Si.

In Group III nitride semiconductor devices, as with semiconductor devices fabricated in other material systems, ohmic contacts with low contact resistance, smooth surfaces, and clear edge definition are essential as they are closely related to the performance, reliability, and reproducibility of the semiconductor devices. Thus, there is a need for improved ohmic contact structures having improved surface morphology and sharp, well-defined edge features and methods of fabrication thereof for Group III nitride semiconductor devices.

SUMMARY

Embodiments of an ohmic contact structure for a Group III nitride semiconductor device and methods of fabrication thereof are disclosed. In general, the ohmic contact structure has a root-mean-squared (RMS) surface roughness of less than 10 nanometers (nm), and more preferably less than or equal to 7.5 nm, and more preferably less than or equal to 5 nm, and more preferably less than or equal to 2 nm, and even more preferably less than or equal to 1.5 nm.

In one embodiment, the ohmic contact structure includes a titanium layer on a surface of a Group III nitride semiconductor structure, a nickel silicide layer on a surface of the titanium layer opposite the surface of the Group III nitride semiconductor structure, and a metal cap layer on a surface of the nickel silicide layer opposite the Group III nitride semiconductor structure. In one embodiment, the Group III nitride semiconductor structure includes gallium nitride (GaN) and/or aluminum gallium nitride (AlGaN). The titanium layer, the nickel silicide layer, and the metal cap layer are selectively formed such that the ohmic contact structure has an RMS surface roughness of less than 10 nm, and more preferably less than or equal to 7.5 nm, and more preferably less than or equal to 5 nm, and more preferably less than or equal to 2 nm, and even more preferably less than or equal to 1.5 nm. The metal cap layer may be formed of, for example, platinum (Pt), palladium (Pd), vanadium (V), tungsten (W), iridium (Ir), or rhodium (Rh).

In another embodiment, the ohmic contact structure includes a titanium layer on a surface of a Group III nitride semiconductor structure, an alternating series of one or more silicon layers and one or more nickel layers on a surface of the titanium layer opposite the surface of the Group III nitride semiconductor structure, and a metal cap layer on a surface of the alternating series of one or more silicon layers and one or more nickel layers opposite the surface of the titanium layer. In one embodiment, the alternating series of one or more silicon layers and one or more nickel layers includes one silicon layer and one nickel layer. In another embodiment, the alternating series of one or more silicon layers and one or more nickel layers includes two or more silicon layers and two or more nickel layers. The ohmic contact structure is thermally annealed such that the one or more silicon layers and the one or more nickel layers form a nickel silicide layer. In one embodiment, the Group III nitride semiconductor structure includes GaN and/or AlGaN. The titanium layer, the alternating series of one or more silicon layers and one or more nickel layers, and the metal cap layer are selectively formed such that the ohmic contact structure has an RMS surface roughness of less than 10 nm, and more preferably less than or equal to 7.5 nm, and more preferably less than or equal to 5 nm, and more preferably less than or equal to 2 nm, and even more preferably less than or equal to 1.5 nm. The metal cap layer may be formed of, for example, Pt, Pd, V, W, Ir, or Rh.

In another embodiment, the ohmic contact structure includes a titanium layer on a surface of a Group III nitride semiconductor structure, a first silicon layer on a surface of the Group III nitride semiconductor structure, a first nickel layer on a surface of the first silicon layer opposite the Group III nitride semiconductor structure, a second silicon layer on a surface of the first nickel layer opposite the first silicon layer, a second nickel layer on a surface of the second silicon layer opposite the first nickel layer, a third silicon layer on a surface of the second nickel layer opposite the second silicon layer, a third nickel layer on a surface of the third silicon layer opposite the second nickel layer, and a metal cap layer on a surface of the third nickel layer opposite the third silicon layer. The ohmic contact structure is thermally annealed such that silicon and nickel layers chemically react to form a nickel silicide layer. In one embodiment, the Group III nitride semiconductor structure includes GaN and/or AlGaN. The titanium layer, the alternating silicon and nickel layers, and the metal cap layer are selectively formed such that the ohmic contact structure has an RMS surface roughness of less than 10 nm, and more preferably less than or equal to 7.5 nm, and more preferably less than or equal to 5 nm, and more preferably less than or equal to 2 nm, and even more preferably less than or equal to 1.5 nm. The metal cap layer may be formed of, for example, Pt, Pd, V, W, Ir, or Rh.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 7:
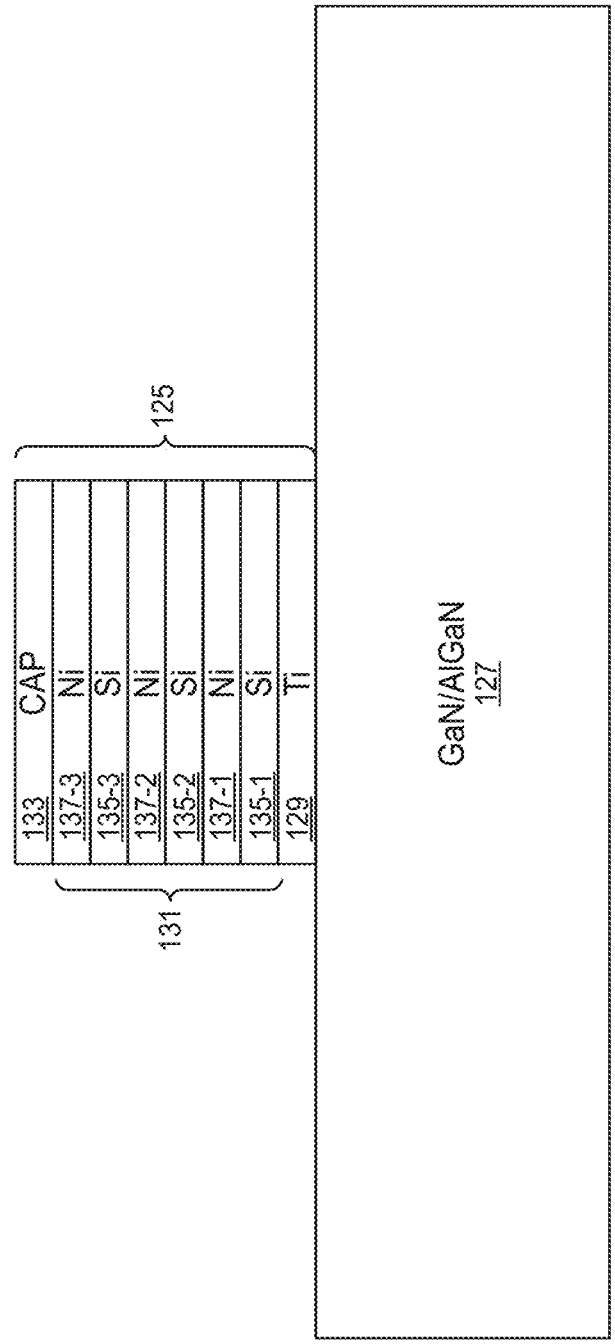
FIG. 7 illustrates an ohmic contact structure for a Group III nitride semiconductor device according to one embodiment of the present disclosure.
Figure 8A:
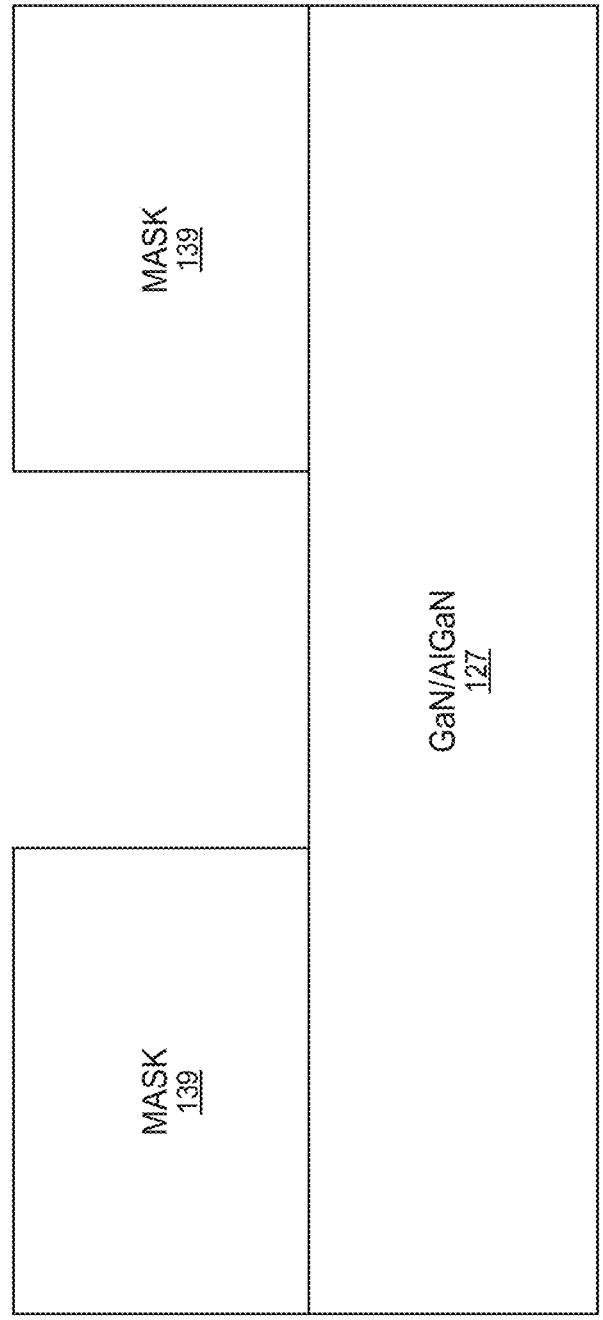
Figure 8B:
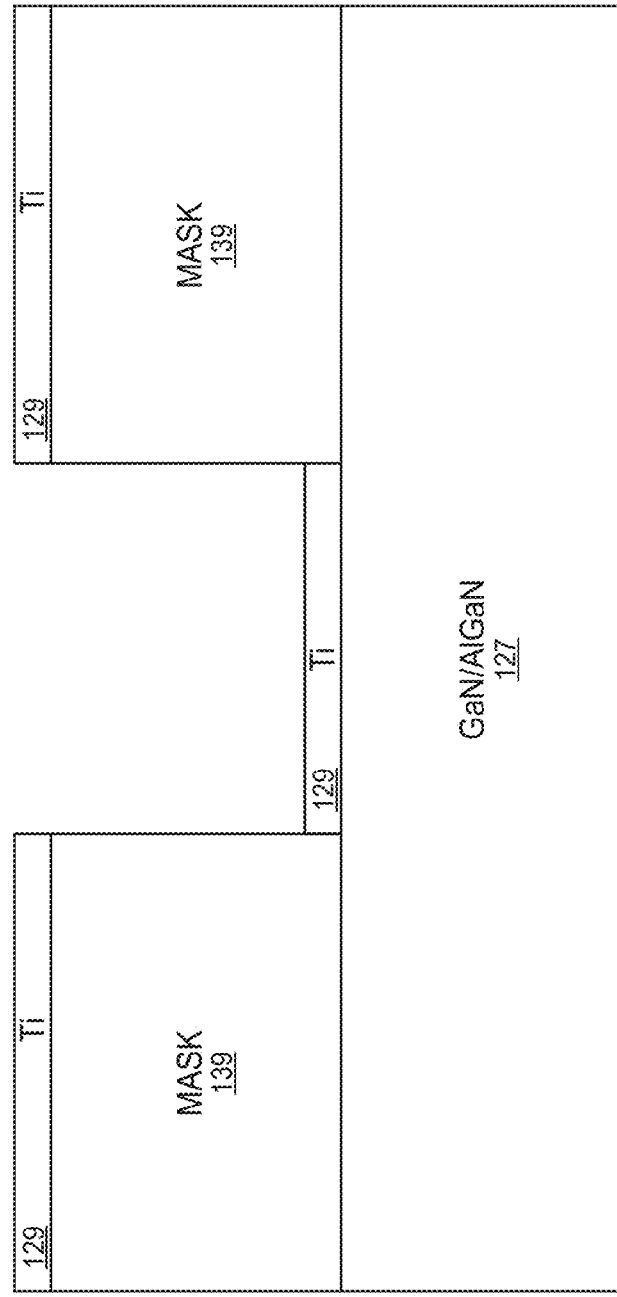
Figure 8C:
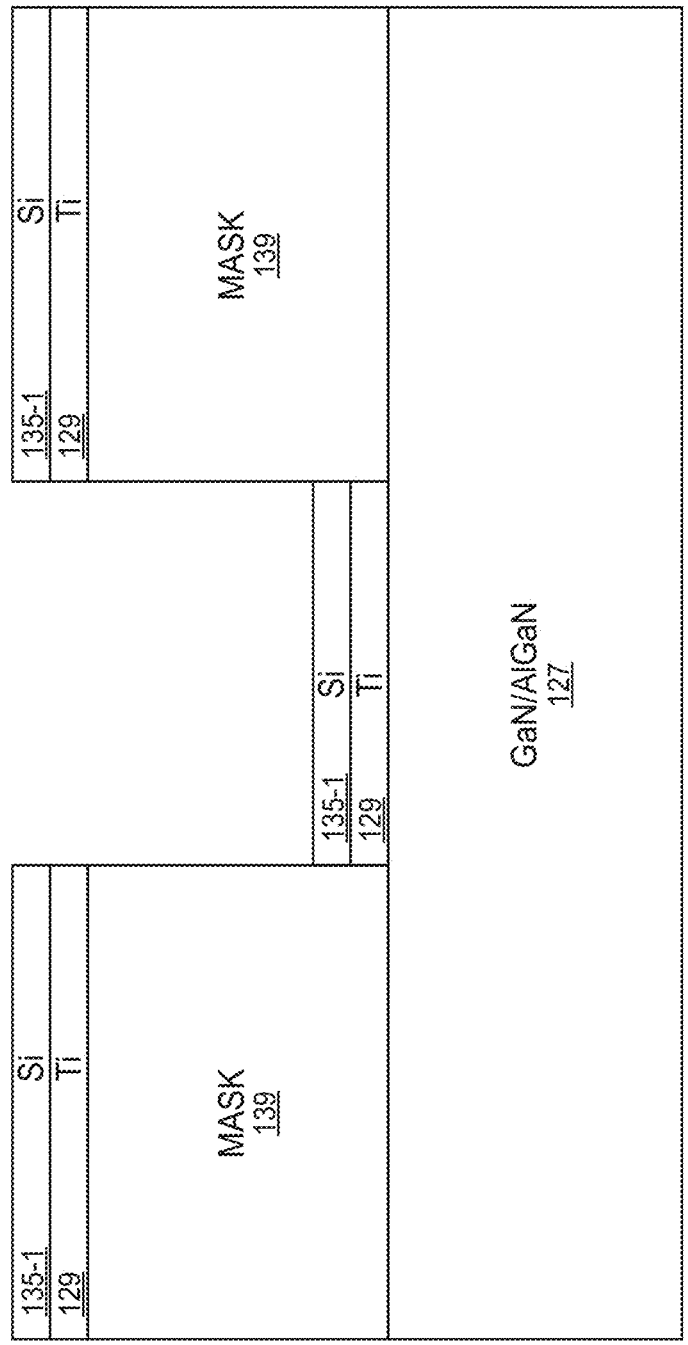
Figure 8D:
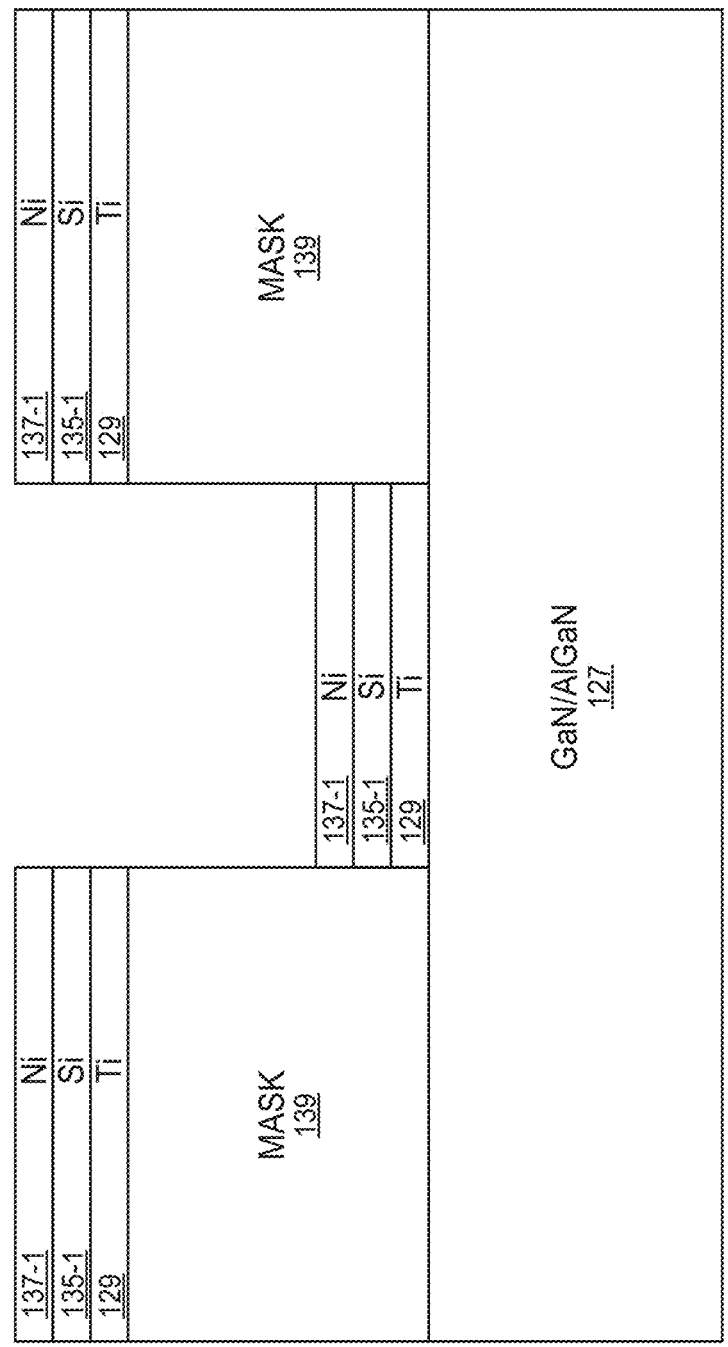
Figure 8E:
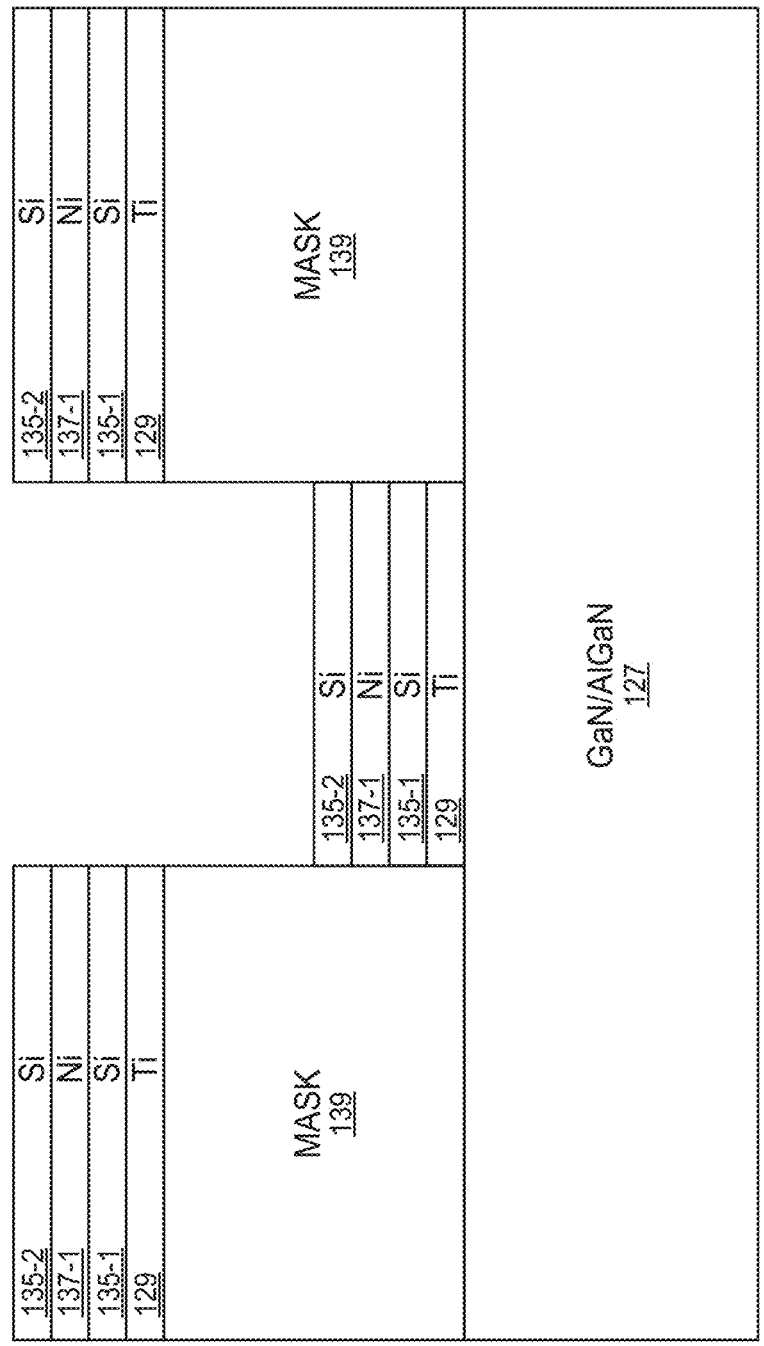
Figure 8F:
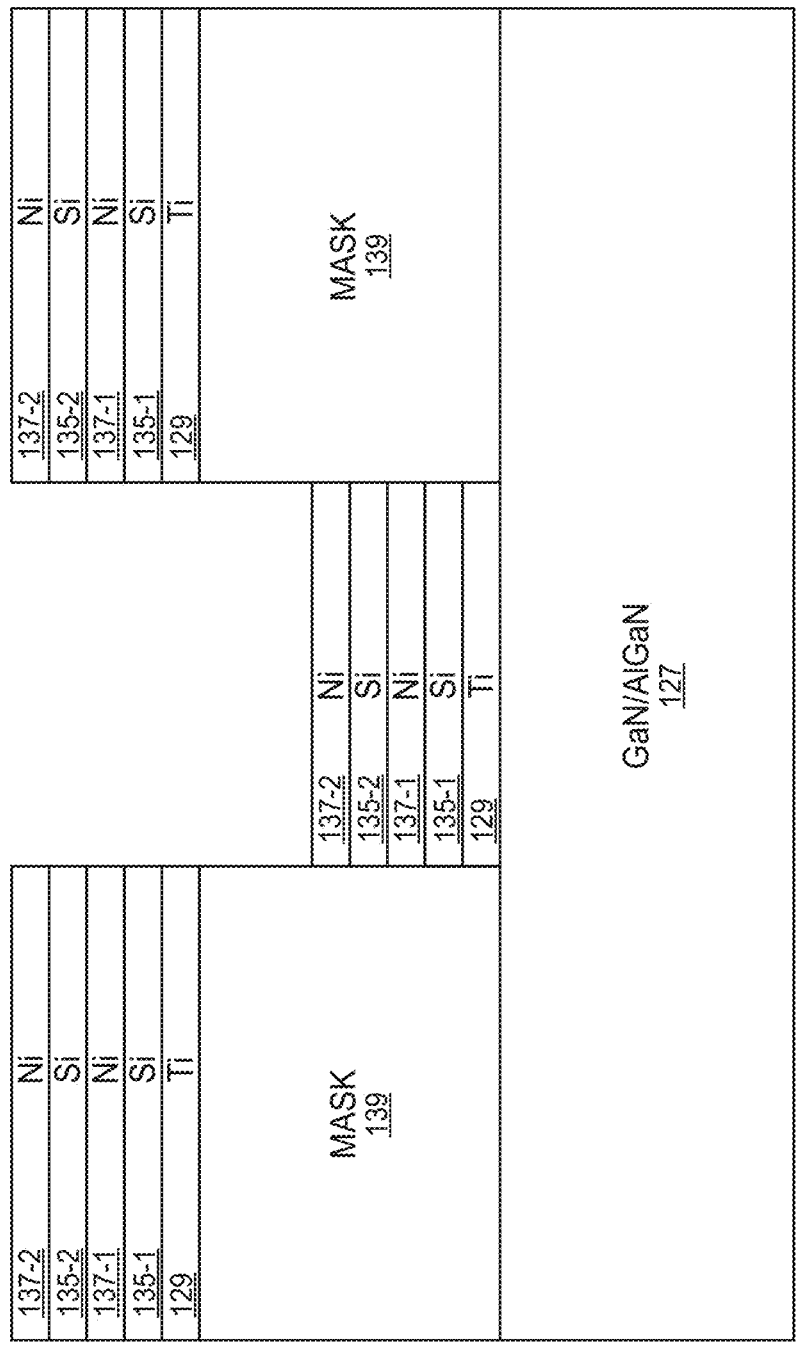
Figure 8G:
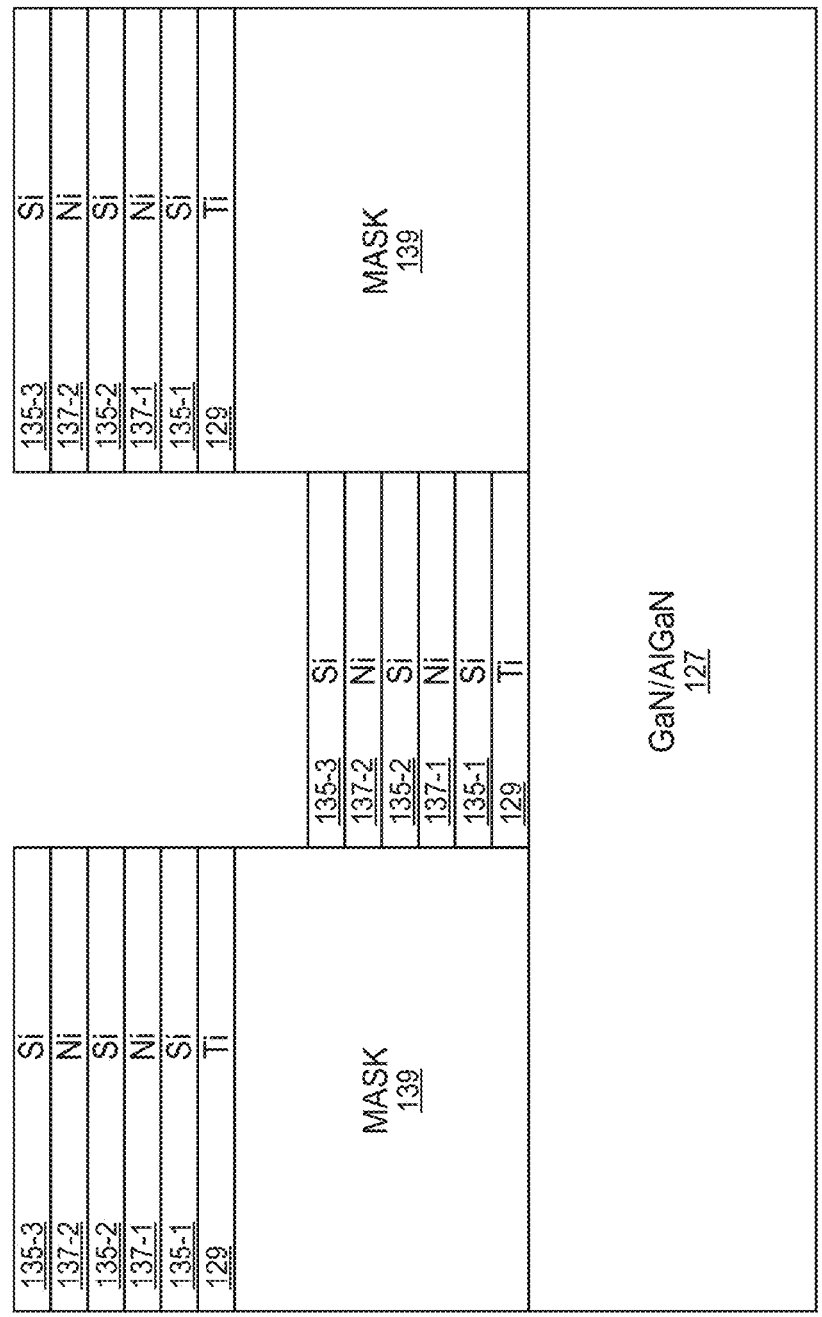
Figure 8H:
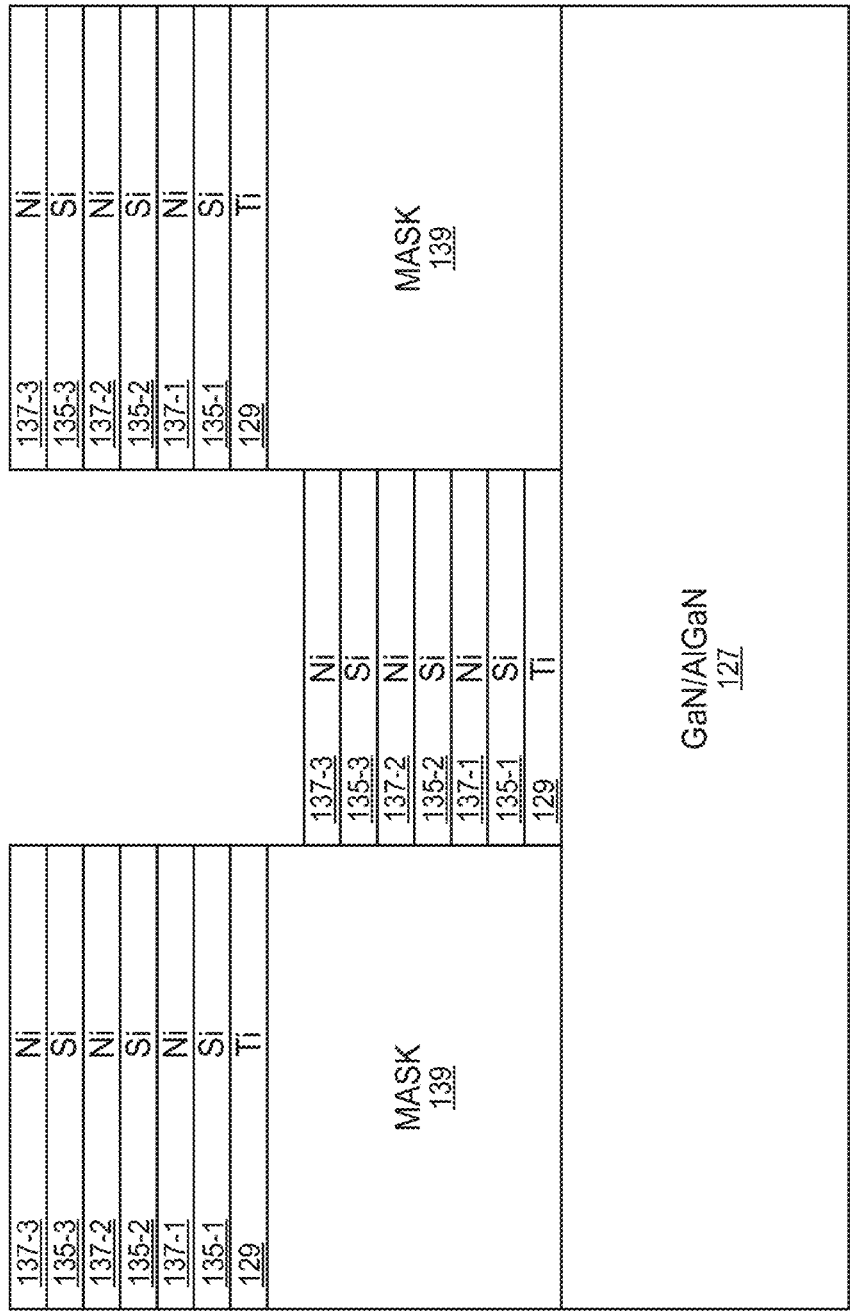
Figure 8I:
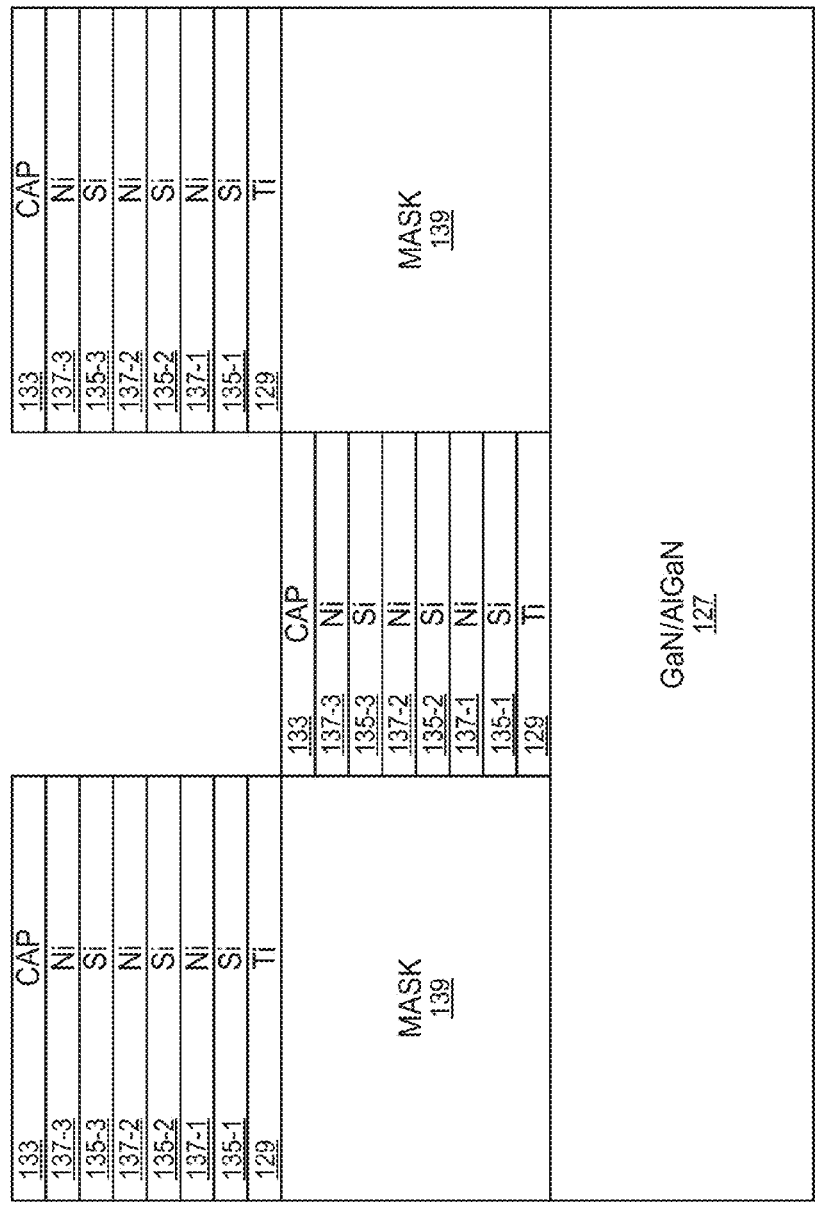
Figure 9A:
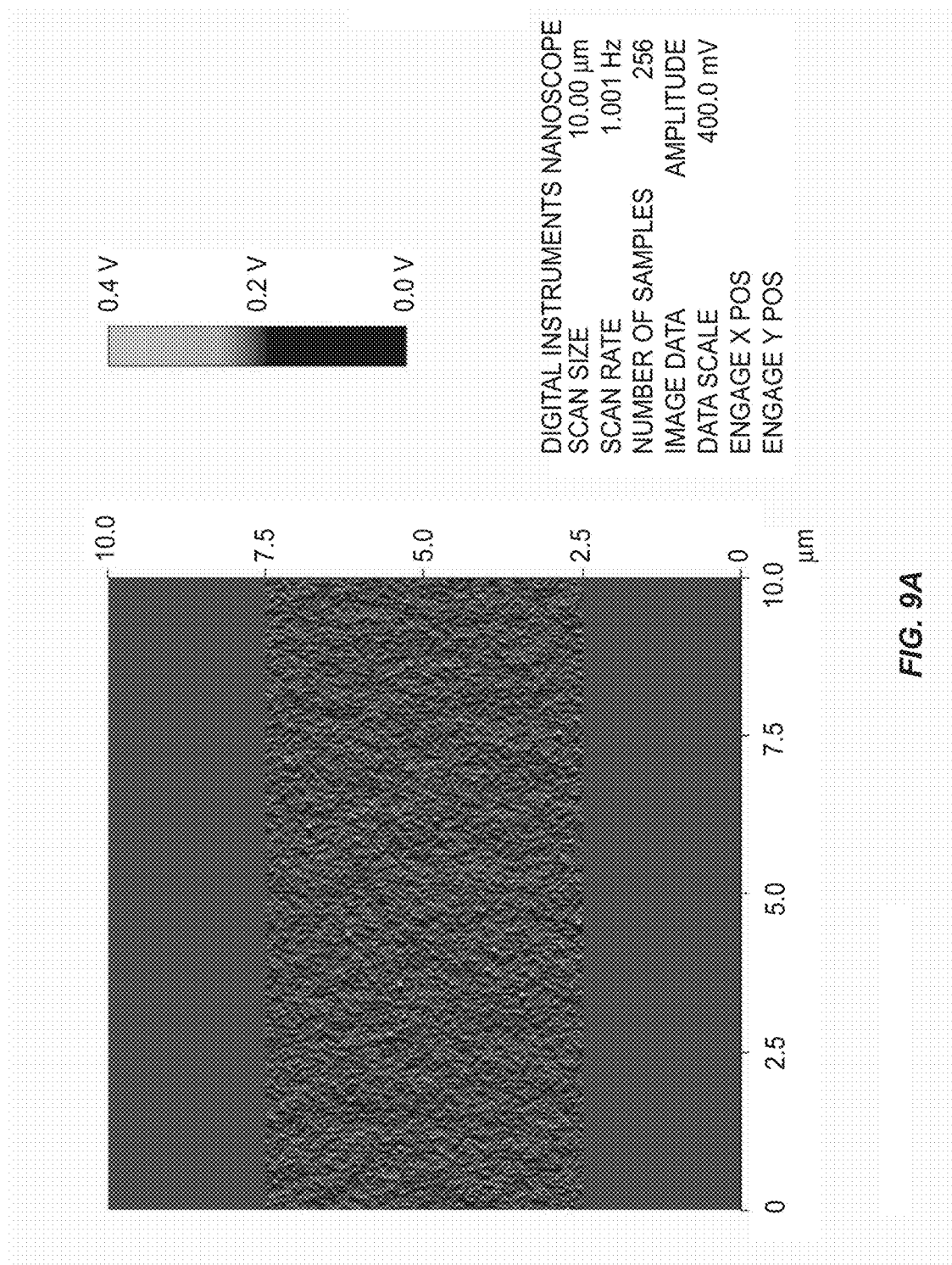
Figure 9B:
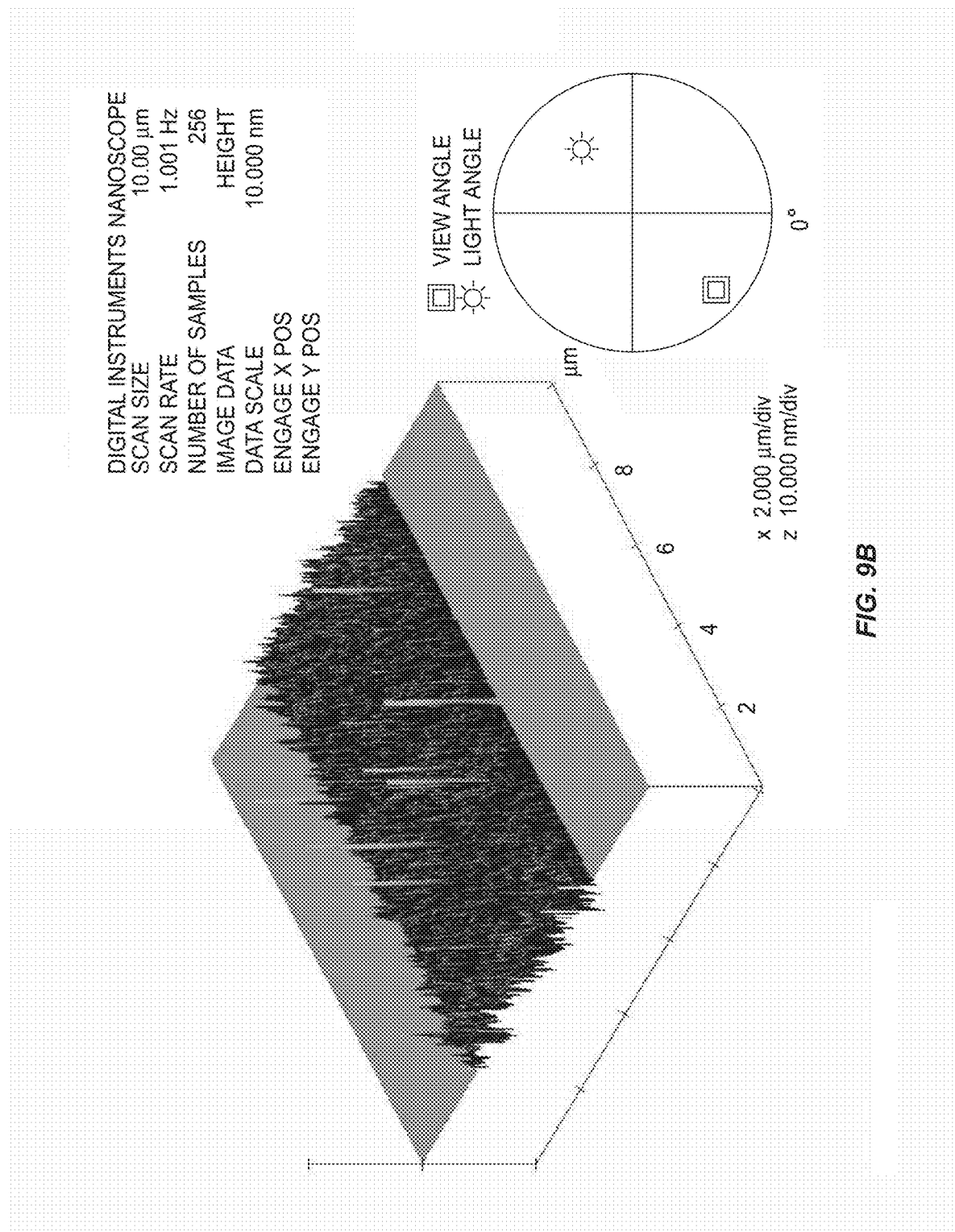
Figure 9C:
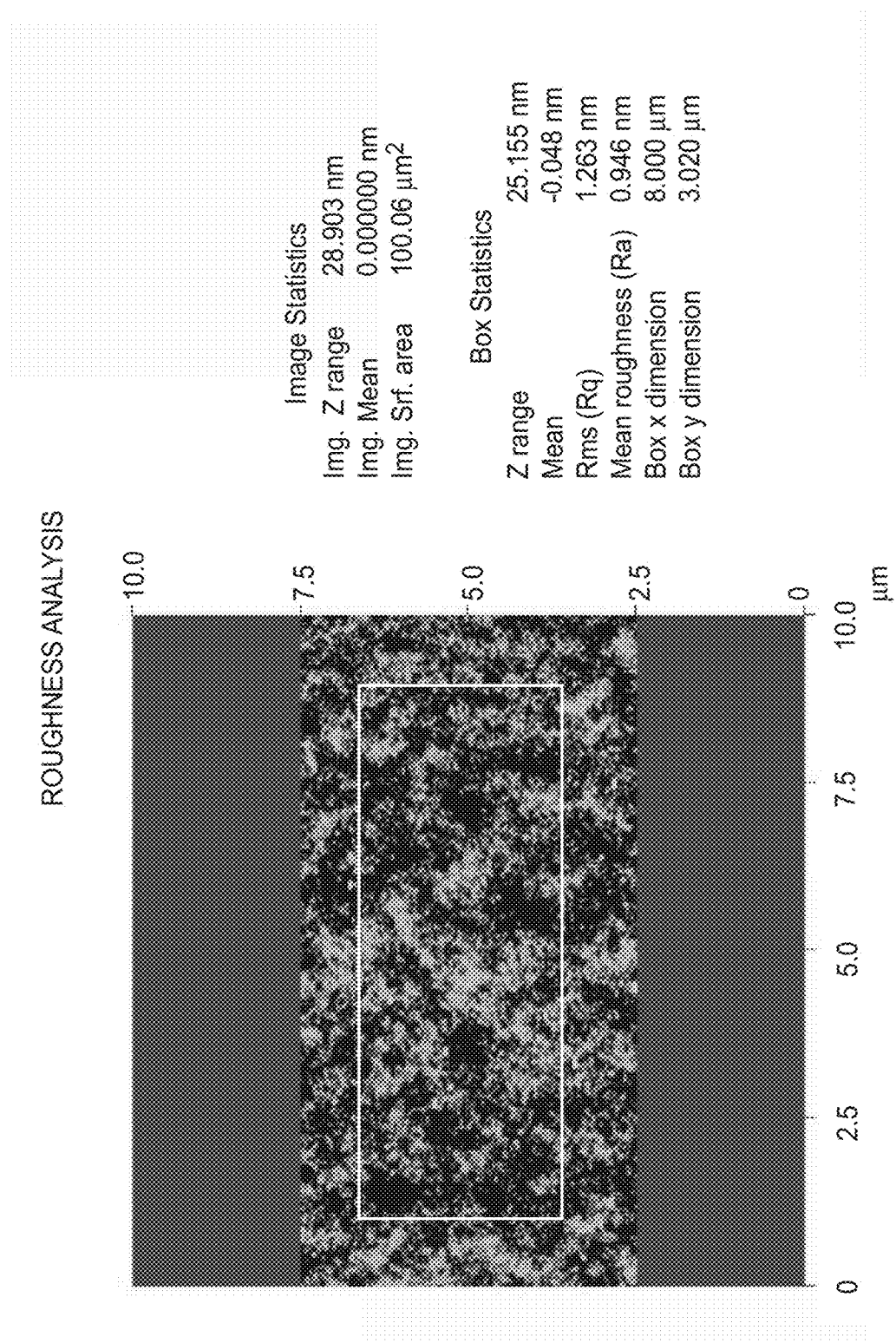

FIGS. 8A through 8J graphically illustrate fabrication of the ohmic contact structure of FIG. 7 according to one embodiment of the present disclosure; and FIGS. 9A through 9C graphically illustrate Atomic Force Microscopy (AFM) data including a root-mean-squared (RMS) surface roughness of an exemplary embodiment of an ohmic contact structure according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to cross-sectional illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, the embodiments described herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Some embodiments of the disclosure are described with reference to semiconductor layers and/or regions which are characterized as having a conductivity type such as N type or P type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in $N^+$, $N^{31}$, $P^+$, $P^-$, $N^{++}$, $N^{--}$, $P^{++}$, $P^{--}$, or the like), to indicate a relatively larger ("+") or smaller ("−") concentration of majority carriers compared to another layer or region. However, such notation does not imply the existence of a particular concentration of majority or minority carriers in a layer or region.

Silicon carbide (SiC) substrates/layers discussed herein may be 4H polytype silicon carbide substrates/layers. Other SiC candidate polytypes, such as 3C, 6H, and 15R polytypes, however, may be used. Appropriate SiC substrates are available from Cree Research, Inc., of Durham, N.C., the assignee of the present invention, and the methods for producing such substrates are set forth in the scientific literature as well as in a number of commonly assigned U.S. patents, including but not limited to U.S. Pat. No. RE34,861, U.S. Pat. Nos. 4,946,547, and 5,200,022, the disclosures of which are incorporated herein in their entirety by reference.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where 1>x>0 are often used to describe these compounds. Techniques for epitaxial growth of Group III nitrides have become reasonably well developed and reported in the appropriate scientific literature, and in commonly assigned U.S. Pat. Nos. 5,210,051, 5,393,993, and 5,523,589, the disclosures of which are hereby incorporated herein in their entirety by reference.

A contact structure for a semiconductor device may provide ohmic contact with an underlying semiconductor material. In a Group III nitride semiconductor device, such as a High Electron Mobility Transistor (HEMT), a source/drain contact may provide ohmic contact with a 2 Dimensional Electron Gas (2DEG) in a Group III nitride semiconductor material(s) such as gallium nitride (GaN), aluminum gallium nitride, indium gallium nitride, indium nitride, indium aluminum nitride, and/or indium gallium aluminum nitride. While aluminum-nickel structures may provide ohmic contact with Group III nitride semiconductor materials, an aluminum-nickel structure may be subject to galvanic corrosion, chemical attack during subsequent etching, and/or adhesion problems.

According to some embodiments of the present disclosure, a source/drain contact for a semiconductor layer may include a layer of a first metal on the semiconductor layer and a silicide layer including a second metal (i.e., a silicide of the second metal) on the layer of the first metal, with the first and second metals being different. For example, the first metal may be titanium and/or any other suitable metal, and the second metal may be nickel and/or any other suitable metal. More particularly, alternating layers of silicon and the second metal may be formed on the layer of the first metal and then annealed to form the silicide layer. In addition, a layer of a third metal may be formed on the alternating layers of silicon and the second metal before annealing to thereby reduce oxidation of the contact structure. The third metal may be gold, platinum, palladium, and/or any other suitable metal. The resulting ohmic contact structure may be chemically stable and/or corrosion resistant, and/or may provide a low resistance contact with the underlying semiconductor layer while maintaining adhesion with the underlying semiconductor layer over a useful life of the device.

Figure 1:
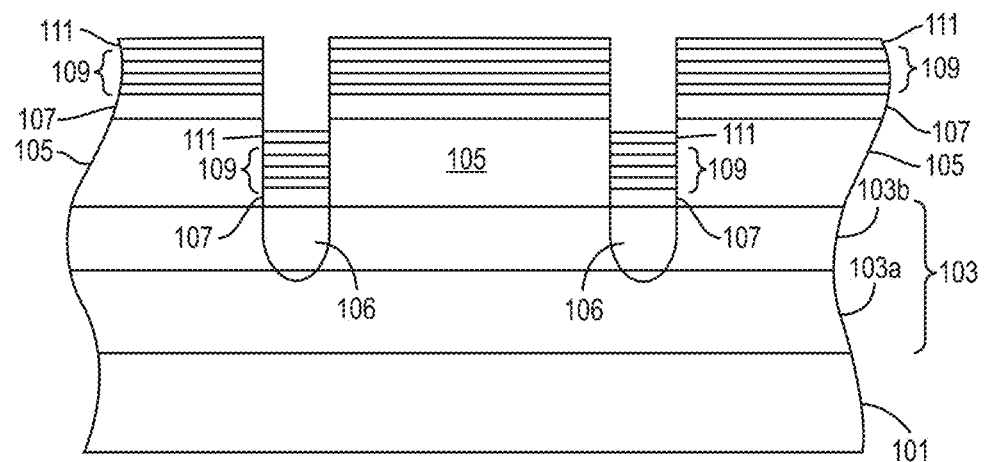
FIGS. 1 through 4 are cross sectional views illustrating operations of forming ohmic contact structures according to some embodiments of the present disclosure.

FIGS. 1 to 4 are cross sectional views illustrating operations of forming ohmic contact structures according to embodiments of the present disclosure. As shown in FIG. 1, a semiconductor structure 103, such as a semiconductor structure for a Group III nitride semiconductor HEMT (High Electron Mobility Transistor), may be formed on a substrate 101 such as a silicon carbide (SiC) substrate or a sapphire substrate. The substrate 101 may be a semi-insulating silicon carbide (SiC) substrate that may be, for example, the 4H polytype of silicon carbide. Other silicon carbide candidate polytypes may include the 3C, 6H, and 15R polytypes. The substrate 101 may be a High Purity Semi-Insulating (HPSI) substrate, available from Cree, Inc. The term "semi-insulating" is used descriptively herein, rather than in an absolute sense.

In some embodiments of the present disclosure, the silicon carbide bulk crystal may have a resistivity equal to or higher than about $1 \times 10^5$ ohm-cm at room temperature. Exemplary SiC substrates that may be used in some embodiments of the present disclosure are manufactured by, for example, Cree, Inc., of Durham, N.C., the assignee of the present disclosure, and methods for producing such substrates are described, for example, in U.S. Pat. No. RE34,861, U.S. Pat. Nos. 4,946,547, 5,200,022, and 6,218,680, the disclosures of which are incorporated by reference herein in their entireties. Similarly, techniques for epitaxial growth of Group III nitrides have been described in, for example, U.S. Pat. Nos. 5,210,051, 5,393,993, and 5,523,589, the disclosures of which are also incorporated by reference herein in their entireties.

Semiconductor structure 103 may include a channel layer 103a and a barrier layer 103b formed of Group III nitride semiconductor materials having different bandgaps, such that an interface between the channel layer 103a and the barrier layer 103b defines a heterojunction. Channel layer 103a may be a Group III nitride layer, such as GaN. Channel layer 103a may also include other Group III nitride layers, such as indium gallium nitride (InGaN), aluminum indium gallium nitride (AlInGaN), or the like. Channel layer 103a may be undoped (i.e., "unintentionally doped"), and may be grown to a thickness of greater than about 20 Angstroms. Channel layer 103a may also be a multi-layer structure, such as a superlattice or combinations of GaN, AlGaN, or the like.

Barrier layer 103b may be a Group III nitride layer, such as $Al_xGa_{1-x}N$ (where 0<x<1). The barrier layer 103b may also include other Group III nitride layers, such as AlInGaN, AlN, and/or combinations of layers thereof. Barrier layer 103b may, for example, be from about 0.1 nanometer (nm) to about 100 nm thick, but may be thin enough to reduce substantial cracking and/or defect formation therein. In some embodiments of the present disclosure, the barrier layer 103b may be a highly-doped n-type layer. For example, the barrier layer 103b may be doped to a concentration of about $10^{19}$ cm$^{-3}$. While semiconductor structure 103 is shown with channel layer 103a and barrier layer 103b for purposes of illustration, semiconductor structure 103 may include additional layers/structures/elements such as a buffer and/or nucleation layer(s) between channel layer 103a and substrate 101, and/or a cap layer on barrier layer 103b. HEMT structures including substrates, channel layers, barrier layers, and other layers are discussed by way of example in U.S. Pat. Nos. 5,192,987, 5,296,395, 6,316,793, 6,548, 333, 7,544,963, 7,548,112, 7,592,211, U.S. Publication No. 2006/0244010, U.S. Publication No. 2007/0018210, and U.S. Publication No. 2007/0164322, the disclosures of which are hereby incorporated herein in their entirety by reference.

As further shown in FIG. 1, a photoresist lift-off mask 105 may be formed on semiconductor structure 103, exposing portions of semiconductor structure 103 where ohmic contacts will be formed. Then, layers of ohmic contact materials may be formed on photoresist lift-off mask 105 and on exposed portions of semiconductor structure 103 to provide the structure shown in FIG. 1. More particularly, a layer 107 of a first metal may be formed on photoresist lift-off mask 105 and on exposed portions of semiconductor structure 103, and alternating layers 109 of silicon and a second metal may be formed on layer 107 of the first metal. In addition, a layer 111 of a third metal may be formed on alternating layers 109 of silicon and the second metal. By way of example, layer 107 may be a layer of titanium (Ti) and/or any other suitable metal, alternating layers 109 may be alternating layers of silicon (Si) and nickel (Ni) (and/or any other suitable metal), and layer 111 may be a layer of gold (Au), platinum (Pt), palladium (Pd) and/or any other suitable metal. Moreover, layer 107, alternating layers 109, and cap layer 111 may be formed in situ in a same reaction chamber, for example, by evaporation. In addition, semiconductor structure 103 may include doped source/drain regions 106 providing electrical coupling between respective layers 107 of the first metal and a 2DEG at an interface between channel and barrier layers 103a and 103b. Doped source/drain regions 106, for example, may be doped to provide n-type conductivity.

Figure 5:
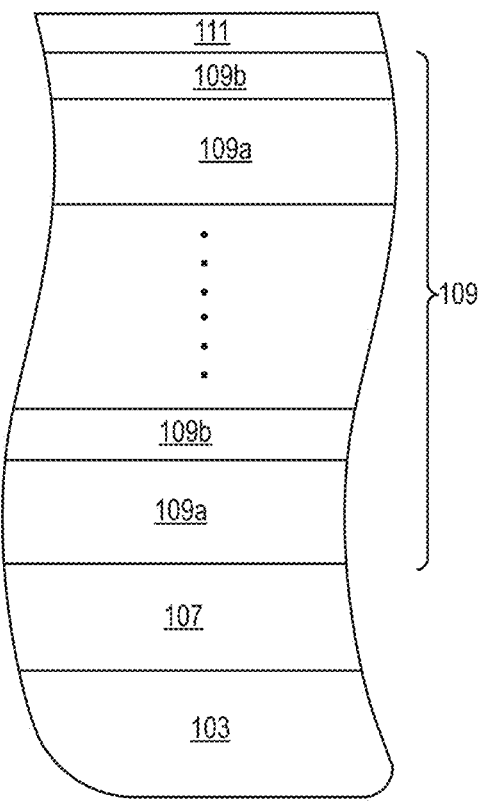
FIG. 5 is a greatly enlarged cross sectional view of an ohmic contact structure on a substrate as shown in FIGS. 1 and 2.

FIG. 5 is a greatly enlarged cross sectional view illustrating portions of layers 107, 109 and 111 on a portion of semiconductor structure 103. In particular, layer 107 of the first metal may be formed directly on a Group III semiconductor nitride layer (such as an AlGaN layer) of semiconductor structure 103, and alternating layers 109a of silicon and 109b of the second metal may be formed on layer 107 of the first metal. As shown in FIG. 5 a first of silicon layers 109a may separate all of layers 109b of the second metal from layer 107 of the first metal. More particularly, a first of silicon layers 109a may be directly on layer 107 of the first metal. According to some embodiments of the present disclosure, silicon layers 109a may be thicker than adjacent layers 109b of the second metal, and more particularly, thicknesses of silicon layers 109a may be about 2 times greater than thickness of adjacent layers 109b of the second metal.

According to particular embodiments of the present disclosure, layer 107 may be a layer of titanium, layers 109a may be layers of silicon, and layers 109b may be layers of nickel. Thicknesses of silicon layers 109a may be in the range of about 400 Angstroms to about 600 Angstroms and thicknesses of layers 109b of nickel may be in the range of about 200 Angstroms to about 300 Angstroms, and more particularly, thicknesses of silicon layers 109a may be about 500 Angstroms and thicknesses of layers 109b of nickel may be about 250 Angstroms. More generally, thickness of layers 109a and 109b may be selected to provide in the range of about 45 to about 55 atomic weight percent of silicon in the combination of alternating layers 109, and more particularly, in the range of about 48 to about 52 atomic weight percent of silicon. According to some embodiments of the present disclosure, thicknesses of layers 109a and 109b may be selected to provide about 50 atomic weight percent of silicon in the combination of alternating layers 109 of silicon and nickel.

Alternating layers 109a and 109b may include at least one layer 109a of silicon and at least one layer 109b of nickel to provide at least one pair of silicon and nickel layers 109a and 109b. According to some embodiments of the present disclosure, between two and ten pairs of silicon and nickel layers 109a and 109b may be included in stack 109, and according to particular embodiments, three or four pairs of silicon and nickel layers 109a and 109b may be provided. According to other embodiments of the present disclosure, at least two pairs of silicon and nickel layers 109a and 109b may be included. While pairs of silicon and nickel layers are shown by way of example, a last nickel layer may be omitted so that there is one more silicon layer than nickel layer. According to some embodiments of the present disclosure, a single layer 109b of the second metal may be sandwiched between two layers 109a of silicon.

In addition, a cap layer 111 may be provided on the alternating layers 109 so that the alternating layers 109 are sandwiched between cap layer 111 and titanium layer 107. Cap layer 111, for example, may be a layer of gold, palladium, and/or platinum, and cap layer 111 may have a thickness of less than about 500 Angstroms, and more particularly, in the range of about 50 Angstroms to about 200 Angstroms. According to other embodiments of the present disclosure, cap layer 111 may be omitted. Cap layer 111, for example, may reduce oxidation of alternating layers 109 and/or of a subsequently formed silicide.

Figure 2:
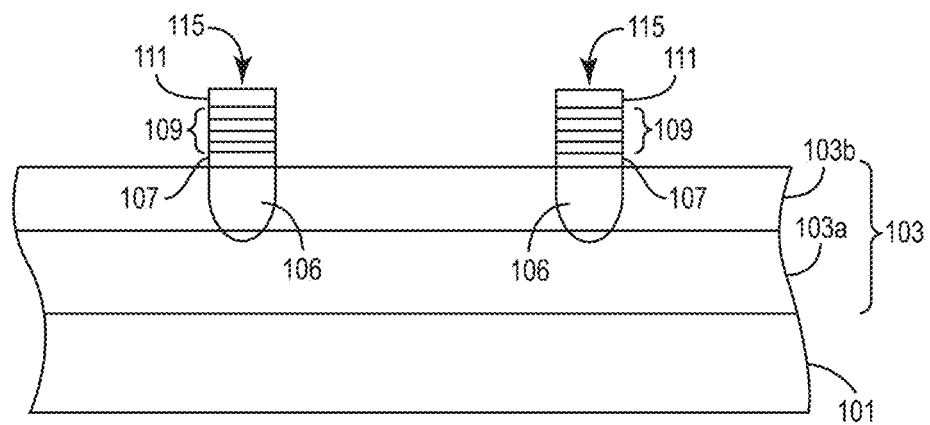

As shown in FIG. 2, photoresist lift-off mask 105 and portions of layers 107, 109, and 111 thereon may be removed. Accordingly, separate ohmic contact structures 115 (including respective layer 107 of the first metal, alternating layers 109, and cap layer 111) may remain on semiconductor structure 103 having the structure of FIG. 5. While lift-off patterning is discussed by way of example in FIGS. 1 and 2, ohmic contact structures 115 may be formed using other operations. For example, blanket layers 107, 109, and 111 may be formed directly on semiconductor structure 103 (i.e., without a photoresist lift-off mask), and then patterned using subsequent photolithographic masking and etch operations.

The alternating layers 109 may then be subjected to a thermal annealing operation to provide a contact structures 115' including silicide layer 109' of the second metal (e.g., nickel silicide and/or any other suitable metal silicide) on layer 107 of the first metal. More particularly, the thermal anneal may be performed at a temperature sufficient to form the silicide including the second metal (e.g., nickel and/or any other suitable metal) without forming significant silicide of the first metal (e.g., titanium and/or any other suitable metal). Moreover, by providing a first of silicon layers 109a between all of the layers 109b of the second metal and layer 107 of the first metal, mixing of the first and second metals during the thermal annealing operation may be reduced. By way of example, with a titanium layer 107 and nickel layers 109b, a rapid thermal anneal (RTA) may be performed at a temperature that does not exceed about 500 degrees C. to form nickel silicide without significant mixing of titanium and nickel and without significant formation of titanium silicide. The rapid thermal anneal, for example, may be performed at a temperature in the range of about 200 degrees C. to about 500 degrees C.

Moreover, by providing appropriate thicknesses of layers 109a and 109b as discussed above, an atomic weight percent of silicon in the resulting silicide layer 109' may be in the range of about 45 to about 55 atomic weight percent, and more particularly, the range of about 48 to about 52 atomic weight percent. According to some embodiments of the present disclosure, an atomic weight percent of silicon in the resulting silicide layer 109' may be about 50 atomic weight percent. Moreover, a composition of the metal silicide may be relatively uniform throughout a thickness of silicide layer 109'. In addition, cap layer 111 (if included) may reduce oxidation of alternating layers 109 and/or silicide layer 109' before/during/after the thermal annealing operation.

Figure 3:
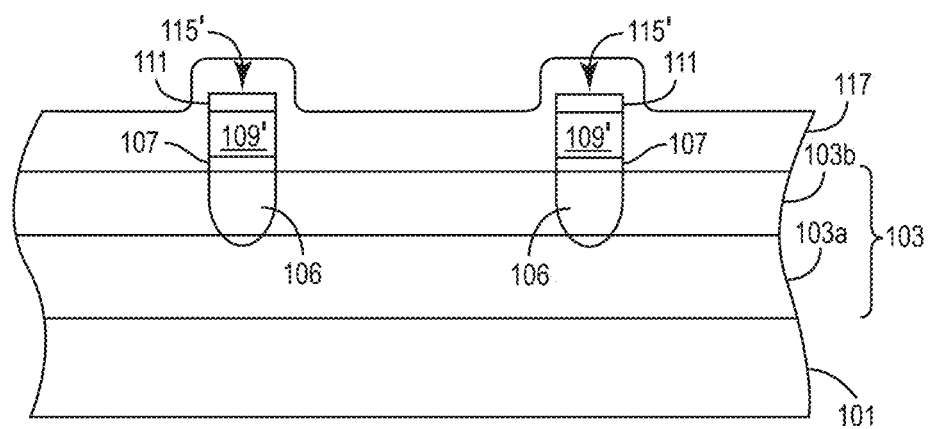

In addition, protective layer 117 may be formed on contact structures 115' before or after the thermal anneal operation as further shown in FIG. 3. Protective layer 117, for example, may be a layer of an insulating material such as silicon nitride ($Si_xN_y$), aluminum nitride (AlN), silicon dioxide ($SiO_2$), and/or other suitable protective material. Other materials may also be used for the protective layer 117. For example, protective layer 117 may also include magnesium oxide, scandium oxide, aluminum oxide and/or aluminum oxynitride. Furthermore, protective layer 117 may be a single layer or may include multiple layers of uniform and/or non-uniform composition.

While cap layer 111 is shown after forming protective layer 117 in FIG. 3 by way of example, cap layer 111 may be removed after the thermal anneal operation and before forming protective layer 117. Moreover, protective layer 117 may be omitted altogether as discussed above.

Figure 4:
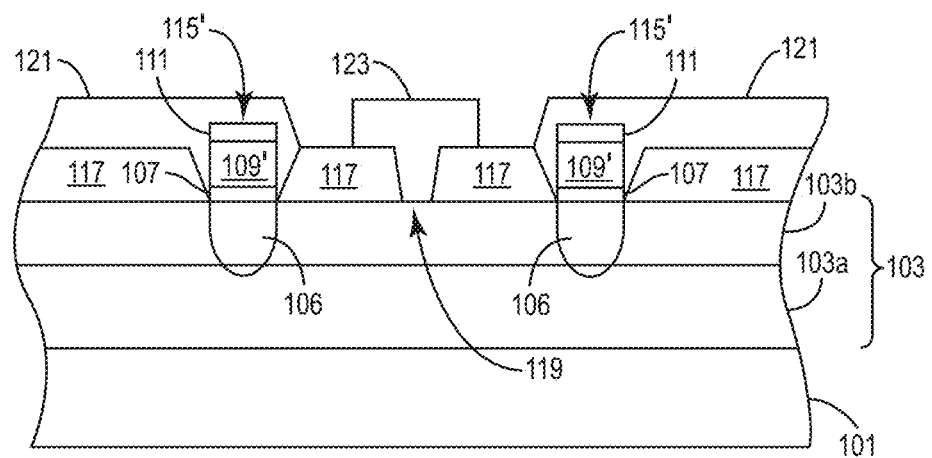

Protective layer 117 may then be patterned using photolithographic mask and etch operations as shown in FIG. 4 to expose contact structures 115' and to expose a gate contact area 119 of semiconductor structure 103. Source/drain electrodes 121 and gate electrode 123 may then be formed as further shown in FIG. 4. According to some embodiments of the present disclosure, source/drain electrodes 121 and gate electrode 123 may be formed at the same time using a same material such as gold and/or any other suitable metal. For example, a blanket layer of a metal (e.g., gold and/or any other suitable metal) may be deposited and then patterned using subsequent photolithographic mask and etch operations to form source/drain electrodes and gate electrode 123. According to other embodiments of the present disclosure, gate electrode 123 (or portions thereof) may be formed separately from source/drain electrodes 121 so that gate electrode 123 and source/drain electrodes may comprise different materials. While gold is discussed by way of example as a gate electrode material, other materials, such as nickel, platinum, nickel silicide, copper, palladium, chromium, tungsten, tungsten silicon nitride, and/or any other suitable conductive material may be used for gate electrode 123. According to some embodiments of the present disclosure, portions of gate electrode 123 may directly contact semiconductor structure 103 to provide a Schottky or otherwise non-ohmic contact therebetween. Accordingly, a material of gate electrode 123 may be selected to provide such a Schottky or other non-ohmic contact with gate contact area 119 of semiconductor structure 103.

According to some embodiments of the present disclosure, gate electrode 123 may be formed, and then a layer of metal for source/drain electrodes 121 may be formed/patterned to provide source/drain electrodes 121. While not shown in FIG. 4, an insulating layer may be formed on gate electrode 123, on ohmic contacts 115', and on protective layer 117. This insulating layer may be patterned to expose portions of ohmic contacts 115', and then source/drain electrodes 121 may be formed on this insulating layer and on exposed portions of respective ohmic contacts 115'.

As shown in FIG. 4, cap layers 111 may be maintained on ohmic contacts 115' after forming source/drain electrodes 121. According to other embodiments of the present disclosure, cap layers 111 may be removed after patterning protective layer 117 and before forming source/drain electrodes 121. According to still other embodiments of the present disclosure, cap layer 111 may be removed prior to forming protective layer 117 or omitted altogether as discussed above with respect to FIGS. 1-3.

The HEMT of FIG. 4 may thus provide conduction between ohmic contacts 115' through a 2-dimensional electron gas (2DEG) at an interface between channel layer 103a and barrier layer 103b. Moreover, conduction through the 2DEG between ohmic contacts 115' may be modulated responsive to an electrical signal applied to gate electrode 123.

Ohmic contact structures and methods of fabrication have been discussed above by way of example with respect to Group III nitride semiconductor HEMT structures. Ohmic contact structures and methods according to embodiments of the present disclosure may be used with other semiconductor devices and/or materials. Ohmic contact structures and methods according to other embodiments of the present disclosure, for example, may be used with MOSFET transistors, with bipolar junction transistors, with light emitting diodes, etc. Moreover, ohmic contact structures and methods according to embodiments of the present disclosure may be used with horizontal devices having all contacts on a same side/face of the device as discussed above with respect to FIGS. 1-4 or with vertical devices having contacts on opposite sides/faces of the device.

Figure 6:
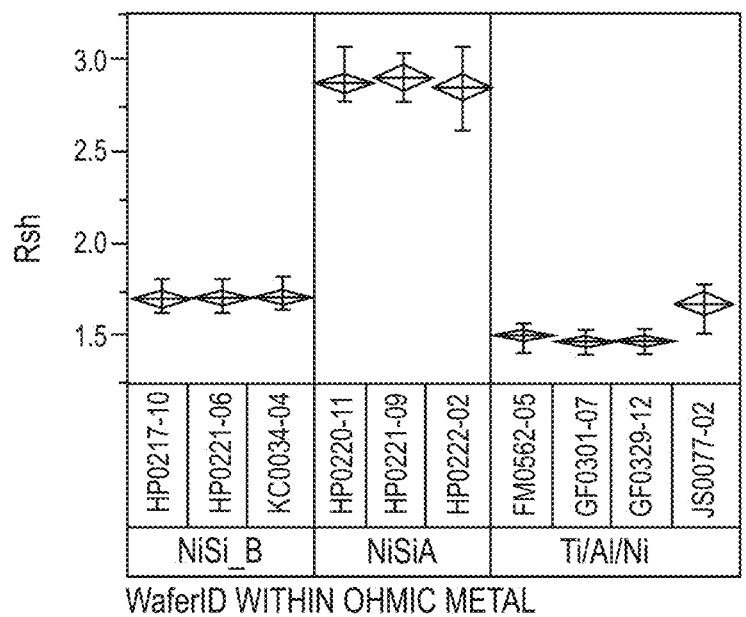
FIG. 6 is a graph illustrating sheet resistances of ohmic contact structures.

FIG. 6 is a graph illustrating average sheet resistances (measured in ohms/square) and ranges thereof for ohmic contact structures fabricated on different wafers. The NiSi_B group includes three wafers (HP0217-10, HP0221-06, and KC0034-04) provided with ohmic contact structures formed according to embodiments of the present disclosure as shown in FIGS. 1-5, with each ohmic contact structure including a titanium layer and a silicide layer formed by annealing three layers of silicon (each having a thickness of about 500 Angstroms) alternating with three layers of nickel (each having a thickness of about 250 Angstroms). The NiSiA group includes three wafers (HP0220-11, HP0221-09, and HP0222-02) provided with ohmic contact structures formed according to embodiments of the present disclosure as shown in FIGS. 1-5, with each ohmic contact structure including a titanium layer and a silicide layer formed by annealing two layers of silicon (each having a thickness of about 500 Angstroms) alternating with two layers of nickel (each having a thickness of about 250 Angstroms). The Ti/Al/Ni comparison group includes four wafers (FM0562-05, GF0301-07, GF0329-12, and JS0077-02) provided with ohmic contact structures, with each ohmic contact structure formed from layers including a titanium layer, an aluminum layer, and a nickel layer.

As shown in the graph of FIG. 6, resistances of ohmic contact structures of the NiSi_B group according to embodiments of the present disclosure and the Ti/Al/Ni comparison group may be statistically very similar. As noted above, however, ohmic contact structures including silicides formed by annealing alternating layers of silicon and nickel may provide increased resistance to damage from subsequent etch operations, reduced damage from corrosion, and/or improved adhesion.

FIGS. 7 through 8J describe embodiments of an ohmic contact structure for a Group III nitride semiconductor device and methods of fabrication thereof. In general, the ohmic contact structure has a root-mean-squared (RMS) surface roughness of less than 10 nm (e.g., in a range of and including 0.5 or 1 nm to 10 nm), and more preferably less than or equal to 7.5 nm (e.g., in a range of and including 0.5 or 1 nm to 7.5 nm), and more preferably less than or equal to 5 nm (e.g., in a range of and including 0.5 or 1 nm to 5 nm), and more preferably less than or equal to 2 nm (e.g., in a range of and including 0.5 or 1 nm to 2 nm), and even more preferably less than or equal to 1.5 nm (e.g., in a range of and including 0.5 or 1 nm to 1.5 nm).

FIG. 7 illustrates an ohmic contact structure 125 on a GaN/AlGaN structure 127 according to one embodiment of the present disclosure. The GaN/AlGaN structure 127 includes one or more layers of GaN and/or AlGaN in which one or more semiconductor devices are formed. The semiconductor devices may be, for example, High Electron Mobility Transistors (HEMTs), Metal-Oxide-Semiconductor Field Effect Transistors (MOSFETs), PIN diodes, bipolar junction transistors, light emitting diodes, or the like. However, one of skill in the art will readily appreciate that other types of semiconductor devices may be fabricated in the GaN/AlGaN structure 127.

Note that while the GaN/AlGaN structure 127 is shown, other Group III nitride semiconductor structures may be used. As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN, and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. Nos. 5,210,051, 5,393,993, 5,523,589, the disclosures of which are hereby incorporated herein by reference in their entireties. It should also be noted that while the present disclosure focuses on the GaN/AlGaN structure 127 and similar Group III nitride semiconductor structures, similar ohmic contact structures may be utilized for other types of semiconductor structures such as, for example, silicon carbide semiconductor structures.

In this embodiment, the ohmic contact structure 125 includes a titanium metal layer 129 on a surface of the GaN/AlGaN structure 127, a nickel silicide (NiSi) layer 131, and a metal cap layer 133. The nickel silicide layer 131 is formed by thermally annealing an alternating series of silicon and nickel layers, which in this embodiment includes a first silicon layer 135-1 on a surface of the titanium metal layer 129 opposite the GaN/AlGaN structure 127, a first nickel layer 137-1 on a surface of the first silicon layer 135 opposite the GaN/AlGaN structure 127, a second silicon layer 135-2 on a surface of the first nickel layer 137-1 opposite the first silicon layer 135-1, a second nickel layer 137-2 on a surface of the second silicon layer 135-2 opposite the first nickel layer 137-1, a third silicon layer 135-3 on a surface of the second nickel layer 137-2 opposite the second silicon layer 135-2, and a third nickel layer 137-3 on a surface of the third silicon layer 135-3 opposite the second nickel layer 137-2. In one preferred embodiment, the titanium metal layer 129 is directly on the surface of the GaN/AlGaN structure 127, the first silicon layer 135-1 is directly on the surface of the titanium metal layer 129 opposite the GaN/AlGaN structure 127, the first nickel layer 137-1 is directly on the surface of the first silicon layer 135-1 opposite the GaN/AlGaN structure 127, the second silicon layer 135-2 is directly on the surface of the first nickel layer 137-1 opposite the first silicon layer 135-1, the second nickel layer 137-2 is directly on the surface of the second silicon layer 135-2 opposite the first nickel layer 137-1, the third silicon layer 135-3 is directly on the surface of the second nickel layer 137-2 opposite the second silicon layer 135-2, and the third nickel layer 137-3 is directly on the surface of the third silicon layer 135-3 opposite the second nickel layer 137-2, and the metal cap layer 133 is directly on the surface of the third nickel layer 137-3 opposite the third silicon layer 135-3.

The titanium metal layer 129 provides an ohmic contact to the GaN/AlGaN structure 127. The nickel silicide layer 131 protects the titanium metal layer 129. The silicon layers 135-1 through 135-3 and the nickel layers 137-1 through 137-3 are selectively formed such that, during subsequent thermal annealing, the silicon layers 135-1 through 135-3 and the nickel layers 137-1 through 137-3 chemically react to form nickel silicide, which has a lower resistivity than nickel disilicide. More specifically, in order to selectively form the nickel silicide layer 131, the thicknesses of the silicon layers 135-1 through 135-3 and the nickel layers 137-1 through 137-3 are selected such that an atomic weight percentage of silicon in the silicon and nickel layers 135-1 through 135-3 and 137-1 through 137-3 is in a range of and including 45% to 60%, and more particularly, in a range of and including 48% to 52%, and even more particularly, equal to about 50%. As a result, when thermally annealed, the silicon layers 135-1 through 135-3 and the nickel layers 137-1 through 137-3 chemically react to form nickel silicide, rather than nickel disilicide. In one embodiment, a ratio of a combined thickness of the silicon layers 135-1 through 135-3 to a combined thickness of the nickel layers 137-1 through 137-3 is, or is approximately, 2:1. As discussed below, formation of the nickel silicide layer 131 by thermally annealing the silicon layers 135-1 through 135-3 and the nickel layers 137-1 through 137-3 is performed at a temperature sufficient to form the nickel silicide layer 131 without significant chemical reaction between the titanium metal layer 129 and the first silicon layer 135-1. As a result, the titanium metal layer 129 remains chemically unchanged and, therefore, maintains its preferred ohmic contact characteristics (e.g., low resistivity). The metal cap layer 133 may be platinum (Pt), palladium (Pd), vanadium (V), tungsten (W), Iridium (Ir), or Rhodium (Rh). Among other things, the metal cap layer 133 protects the silicon and nickel layers 135 and 137 and/or the subsequently formed nickel silicide layer 131 from chemical attack during subsequent processing (e.g., oxidation).

In one preferred embodiment, a thickness of the titanium metal layer 129 is in a range of and including 200 Angstroms±10%, a thickness of the first silicon layer 135-1 is in a range of and including 500 Angstroms±15%, a thickness of the first nickel layer 137-1 is in a range of and including 250 Angstroms±5%, a thickness of the second silicon layer 135-2 is in a range of and including 500 Angstroms±10%, a thickness of the second nickel layer 137-2 is in a range of and including 250 Angstroms±5%, a thickness of the third silicon layer 135-3 is in a range of and including 500 Angstroms±10%, a thickness of the third nickel layer 137-3 is in a range of and including 250 Angstroms±5%, and a thickness of the metal cap layer 133 is in a range of and including 100 Angstroms±50%. In another embodiment, the thickness of the titanium metal layer 129 is in a range of and including about 7.8±0.78% of a total thickness of the ohmic contact structure 125, the thickness of the first silicon layer 135-1 is in a range of and including about 19.6±2.94% of the total thickness of the ohmic contact structure 125, the thickness of the first nickel layer 137-1 is in a range of and including about 9.8±0.49% of the total thickness of the ohmic contact structure 125, the thickness of the second silicon layer 135-2 is in a range of and including about 19.6±1.96% of the total thickness of the ohmic contact structure 125, the thickness of the second nickel layer 137-2 is in a range of and including about 9.8±0.49% of the total thickness of the ohmic contact structure 125, the thickness of the third silicon layer 135-3 is in a range of and including about 19.6±1.96% of the total thickness of the ohmic contact structure 125, the thickness of the third nickel layer 137-3 is in a range of and including about 9.8±0.49% of the total thickness of the ohmic contact structure 125, and the thickness of the metal cap layer 133 is in a range of and including about 3.9±1.95% of the total thickness of the ohmic contact structure 125. The preferred thicknesses above aid in the smooth morphology of the ohmic contact structure 125.

The ohmic contact structure 125 may be chemically stable and/or corrosion resistant, and/or may provide a low resistance contact with the underlying GaN/AlGaN structure 127 while maintaining adhesion with the underlying GaN/AlGaN structure 127 over a useful life of the device. As discussed below in more detail, the ohmic contact structure 125 has a root-mean-squared (RMS) surface roughness of less than 10 nm, and more preferably less than or equal to 7.5 nm, and more preferably less than or equal to 5 nm, and more preferably less than or equal to 2 nm, and even more preferably less than or equal to 1.5 nm.

Notably, before proceeding, while the ohmic contact structure 125 of FIG. 7 includes three silicon layers 135-1 through 135-3 and three nickel layers 137-1 through 137-3, the ohmic contact structure 125 is not limited thereto. The ohmic contact structure 125 generally includes an alternating series of silicon and nickel layers. In one embodiment, the alternating series of silicon and nickel layers includes one or more silicon layers and one or more nickel layers. In another embodiment, the alternating series of silicon and nickel layers includes two or more silicon layers and two or more nickel layers. In yet another embodiment, the alternating series of silicon and nickel layers includes three silicon layers and three nickel layers.

FIGS. 8A through 8J graphically illustrate fabrication of the ohmic contact structure 125 of FIG. 7 according to one embodiment of the present disclosure. First, as illustrated in FIG. 8A, the GaN/AlGaN structure 127 is provided. Note that, while not illustrated, the GaN/AlGaN structure 127 may be formed on a substrate, which may be a silicon substrate, a silicon carbide substrate, a sapphire substrate, or the like. For example, the substrate may be a semi-insulating silicon carbide substrate that may be, for example, the 4H polytype of silicon carbide. Other silicon carbide candidate polytypes may include the 3C, 6H, and 15R polytypes. The substrate may be a High Purity Simi-Insulating (HPSI) substrate, available from Cree, Inc. The term "semi-insulating" is used descriptively herein, rather than in an absolute sense.

As also shown in FIG. 8A, a photoresist lift-off mask 139 may be formed on the surface of the GaN/AlGaN structure 127, exposing portions of the surface of the GaN/AlGaN structure 127 where the ohmic contact structure 125 (FIG. 7) is to be formed. Then, layers of ohmic contact materials are formed on the photoresist lift-off mask 139 and on the exposed portions of the surface of the GaN/AlGaN structure 127 to provide the ohmic contact structure 125 of FIG. 7. While lift-off patterning is discussed by way of example in FIGS. 8A through 8J, the ohmic contact structure 125 may be formed using other operations. For example, blanket layers 129, 135-1, 137-1, 135-2, 137-2, 135-3, 137-3, and 133 may be formed directly on the GaN/AlGaN structure 127 (i.e., without a photoresist lift-off mask) and then patterned using subsequent photolithographic masking and etch operations.

As illustrated in FIG. 8B, the titanium metal layer 129 is formed on, and preferably directly on, the surface of the photoresist lift-off mask 139 and the exposed portions of the surface of the GaN/AlGaN structure 127. The titanium metal layer 129 may be formed by, for example, evaporation or sputtering. In one preferred embodiment, the thickness of the titanium metal layer 129 is in the range of and including 200 Angstroms±10%.

Next, as illustrated in FIG. 8C, the first silicon layer 135-1 is formed on, and preferably directly on, the titanium metal layer 129 over both the photoresist lift-off mask 139 and the portion of the surface of the GaN/AlGaN structure 127 exposed by the photoresist lift-off mask 139. Then, as illustrated in FIG. 8D, the first nickel layer 137-1 is formed on, and preferably directly on, the surface of the first silicon layer 135-1 opposite the titanium metal layer 129 over both the photoresist lift-off mask 139 and the portion of the surface of the GaN/AlGaN structure 127 exposed by the photoresist lift-off mask 139. As illustrated in FIGS. 8E through 8H, the process of FIGS. 8C and 8D is repeated to form the second silicon layer 135-2, the second nickel layer 137-2, the third silicon layer 135-3, and the third nickel layer 137-3. The silicon layers 135-1 through 135-3 and the nickel layers 137-1 through 137-3 may be formed by, for example, evaporation or sputtering.

In the preferred embodiment, the silicon layers 135-1 through 135-3 and the nickel layers 137-1 through 137-3 are selectively formed such that, during subsequent thermal annealing, the silicon layers 135-1 through 135-3 and the nickel layers 137-1 through 137-3 chemically react to form nickel silicide, rather than nickel disilicide. More specifically, in one embodiment, the atomic weight ratio of silicon in the silicon and nickel layers 135-1 through 135-3 and 137-1 through 137-3 is in a range of and including 45% to 60%, and more particularly in a range of and including 48% to 52%, and even more particularly equal to approximately 50%. In one preferred embodiment, the ratio of a combined thickness of the silicon layers 135-1 through 135-3 to a combined thickness of the nickel layers 137-1 through 137-3 is, or is approximately, 2:1. In one preferred embodiment, the thickness of the first silicon layer 135-1 is in a range of and including 500 Angstroms±15%, the thickness of the first nickel layer 137-1 is in a range of and including 250 Angstroms±5%, the thickness of the second silicon layer 135-2 is in a range of and including 500 Angstroms±10%, the thickness of the second nickel layer 137-2 is in a range of and including 250 Angstroms±5%, the thickness of the third silicon layer 135-3 is in a range of and including 500 Angstroms±10%, and the thickness of the third nickel layer 137-3 is in a range of and including 250 Angstroms±5%.

Next, as illustrated in FIG. 8I, the metal cap layer 133 is formed on, and preferably directly on, the surface of the third nickel layer 137-3 opposite the third silicon layer 135-3 over both the photoresist lift-off mask 139 and the portion of the surface of the GaN/AlGaN structure 127 exposed by the photoresist lift-off mask 139. The metal cap layer 133 may be formed by, for example, evaporation or sputtering. The metal cap layer 133 may be, for example, Pt, Pd, V, W, Ir, or Rh. In one preferred embodiment, the thickness of the metal cap layer 133 is in the range of and including 100 Angstroms±50%. Notably, the titanium metal layer 129, the silicon layers 135-1 through 135-3, the nickel layers 137-1 through 137-3, and the metal cap layer 133 may be formed in situ in a same reaction chamber.

Next, as illustrated in FIG. 8J, the photoresist lift-off mask 139 is removed (e.g., dissolved). Thermal annealing is then performed such that the silicon layers 135-1 through 135-3 and the nickel layers 137-1 through 137-3 chemically react to form the nickel silicide layer 131. Thermal annealing is performed at a temperature sufficient to form the nickel silicide layer 131 without significant chemical reaction between the titanium metal layer 129 and the first silicon layer 135-1. Further, the first silicon layer 135-1 reduces mixing of the titanium metal layer 129 and the first nickel layer 137-1. More specifically, thermal annealing is performed at a temperature in a range of and including 200° C. to 600° C.

Notably, while not illustrated, optionally, a protective layer may be formed on the ohmic contact structure 125 and exposed surfaces of the GaN/AlGaN structure 127 before or after the thermal anneal operation. The protective layer may be, for example, a layer of an insulating material such as silicon nitride ($Si_xN_y$), aluminum nitride (AlN), silicon dioxide ($SiO_2$), and/or other suitable protective material. Other materials may also be used for the protective layer. For example, the protective layer may also include magnesium oxide, scandium oxide, aluminum oxide, and/or aluminum oxynitride. Furthermore, the protective layer may be a single layer or may include multiple layers of uniform and/or non-uniform composition. The metal cap layer 133 may, in some embodiments, be removed after the thermal anneal operation and before forming the protective layer. The protective layer may then be patterned and etched using photolithographic mask and etch operation(s) to expose the ohmic contact structure 125. In some embodiments, the metal cap layer 133 may be removed after exposing the ohmic contact structure 125.

FIGS. 9A through 9C graphically illustrate Atomic Force Microscopy (AFM) data including an RMS surface roughness of an exemplary embodiment of the ohmic contact structure 125 according to one embodiment of the present disclosure. In this embodiment, the thickness of the titanium metal layer 129 is in a range of and including 200 Angstroms±10%, the thickness of the first silicon layer 135-1 is in a range of and including 500 Angstroms±15%, the thickness of the first nickel layer 137-1 is in a range of and including 250 Angstroms±5%, the thickness of the second silicon layer 135-2 is in a range of and including 500 Angstroms±10%, the thickness of the second nickel layer 137-2 is in a range of and including 250 Angstroms±5%, the thickness of the third silicon layer 135-3 is in a range of and including 500 Angstroms±10%, the thickness of the third nickel layer 137-3 is in a range of and including 250 Angstroms±5%, and the thickness of the metal cap layer 133 is in a range of and including 100 Angstroms±50%. Notably, in this exemplary embodiment, the RMS surface roughness (Rq) is 1.263 nm, as illustrated in the box statistics shown in FIG. 9C.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    a Group III nitride semiconductor structure; and
    an ohmic contact structure having a root-mean-squared (RMS) surface roughness in a range between about 1.3 nanometers (nm) and about 10 nm on a surface of the Group III nitride semiconductor structure, wherein the RMS surface roughness is measured in an area of about 3.0 microns by about 8.0 microns, the ohmic contact structure comprising:
        a layer on the surface of the Group III nitride semiconductor structure; and
        a nickel silicide layer on a surface of the layer opposite the Group III nitride semiconductor structure.

2. The semiconductor device of claim 1, wherein the RMS surface roughness measurement is an atomic force microscopy measurement.

3. The semiconductor device of claim 1, wherein the ohmic contact structure further comprises a metal cap layer on a surface of the nickel silicide layer.

4. The semiconductor device of claim 1, wherein the RMS surface roughness of the ohmic contact structure is less than or equal to 7.5 nm.

5. The semiconductor device of claim 1, wherein the RMS surface roughness of the ohmic contact structure is less than or equal to 5 nm.

6. The semiconductor device of claim 1, wherein the RMS surface roughness of the ohmic contact structure is less than or equal to 2 nm.

7. The semiconductor device of claim 1, wherein the RMS surface roughness of the ohmic contact structure is less than or equal to 1.5 nm.

8. The semiconductor device of claim 1, wherein the layer on the surface of the Group III nitride semiconductor structure comprises titanium.

9. A method of fabrication of a semiconductor device comprising:
    providing a Group III nitride semiconductor structure;
    forming an alternating series of one or more silicon layers and one or more nickel layers on the Group III nitride semiconductor structure; and
    annealing the alternating series of one or more silicon layers and one or more nickel layers thereby forming a nickel silicide structure having a root-mean-squared (RMS) surface roughness in a range between about 1.3 nanometers (nm) and about 10 nm on a surface of the Group III nitride semiconductor structure, wherein the RMS surface roughness is measured in an area about 3.0 microns and about 8.0 microns.

10. The method of claim 9, wherein the RMS surface roughness measurement is an atomic force microscopy measurement.

11. The method of claim 9, wherein the alternating series of one or more silicon layers and one or more nickel layers is annealed at a temperature that is less than 500° C.

12. The method of claim 11, wherein the alternating series of one or more silicon layers and one or more nickel layers is annealed at a temperature that is in a range between about 200° C. and about 500° C.

13. The method of claim 9, wherein the alternating series of one or more silicon layers and one or more nickel layers is annealed at a temperature that is in a range between about 200° C. and about 600° C.

14. The method of claim 9, wherein the RMS surface roughness is less than or equal to 7.5 nm.

15. The method of claim 9, wherein the RMS surface roughness is less than or equal to 5 nm.

16. The method of claim 9, wherein the RMS surface roughness is less than or equal to 2 nm.

17. The method of claim 9, wherein the RMS surface roughness is less than or equal to 1.5 nm.

18. The method of claim 9, wherein the method further comprises forming a metal cap layer on a surface of the alternating series of one or more silicon layers and one or more nickel layers.

19. The method of claim 9, wherein the method further comprises forming a layer between the Group III nitride semiconductor structure and the alternating series of one or more silicon layers and one or more nickel layers.

20. The method of claim 19, wherein the layer between the Group III nitride semiconductor structure and the alternating series of one or more silicon layers and one or more nickel layers is titanium.

21. A semiconductor device comprising:
a Group III nitride semiconductor structure;
an ohmic contact structure having a root-mean-squared (RMS) surface roughness in a range between about 1.3 nanometers (nm) and about 10 nm on a surface of the Group III nitride semiconductor structure, wherein the RMS surface roughness is measured in an area between about 3.0 microns and about 8.0 microns; and
wherein the ohmic contact structure comprises an alternating series of one or more silicon layers and one or more nickel layers opposite the Group III nitride semiconductor structure.

22. The semiconductor device of claim 21, wherein the RMS surface roughness measurement is an atomic force microscopy measurement.

23. The semiconductor device of claim 21, further comprising a layer between the Group III nitride semiconductor structure and the ohmic contact structure.

24. The semiconductor device of claim 23, wherein the layer between the Group III nitride semiconductor structure and the ohmic contact structure comprises titanium.

\* \* \* \* \*